(12) United States Patent
Ahn et al.

(10) Patent No.: US 7,553,708 B2
(45) Date of Patent: Jun. 30, 2009

(54) FABRICATING METHOD FOR A LIQUID CRYSTAL DISPLAY OF HORIZONTAL ELECTRIC FIELD APPLYING TYPE

(75) Inventors: Byung Chul Ahn, Ahnyang-shi (KR); Byoung Ho Lim, Kumi-shi (KR)

(73) Assignee: LG Display Co., Ltd., Seoul (KR)

( * ) Notice: Subject to any disclaimer, the term of this patent is extended or adjusted under 35 U.S.C. 154(b) by 97 days.

(21) Appl. No.: 11/529,592

(22) Filed: Sep. 29, 2006

(65) Prior Publication Data

US 2007/0023753 A1    Feb. 1, 2007

Related U.S. Application Data

(62) Division of application No. 10/815,843, filed on Apr. 2, 2004, now Pat. No. 7,132,689.

(30) Foreign Application Priority Data

Apr. 3, 2003    (KR)    ............ 10-2003-21116

(51) Int. Cl.
*H01L 29/04*    (2006.01)

(52) U.S. Cl. ............ 438/149; 438/128; 438/152; 257/59; 257/72; 257/202; 257/E51.005; 257/E27.111; 257/E29.151

(58) Field of Classification Search ............ 257/72, 257/59, 350, 202; 438/152, 14, 149, 128
See application file for complete search history.

(56) References Cited

U.S. PATENT DOCUMENTS

| | | | |
|---|---|---|---|
| 6,204,610 B1 * | 3/2001 | Komiya | 315/169.3 |
| 6,429,057 B1 * | 8/2002 | Hong et al. | 438/158 |
| 6,531,346 B1 * | 3/2003 | Kim | 438/149 |
| 6,678,018 B2 * | 1/2004 | Park et al. | 349/43 |

(Continued)

FOREIGN PATENT DOCUMENTS

JP    08-110528    4/1996

(Continued)

*Primary Examiner*—A. Sefer
(74) *Attorney, Agent, or Firm*—McKenna Long & Aldridge LLP

(57) ABSTRACT

A liquid crystal display having an applied horizontal electric field comprising: a gate line; a common line substantially parallel to the gate line; a data line arranged to cross the gate line and the common line to define a pixel area; a thin film transistor formed at each crossing of the gate line and the data line; a common electrode formed in the pixel area and connected to the common line; a pixel electrode connected to the thin film transistor, wherein the horizontal electric field is formed between the pixel electrode and the common electrode in the pixel area; a gate pad formed with at least one conductive layer included in the gate line; a data pad formed with at least one conductive layer included in the data line; a common pad formed with at least one conductive layer included in the common line; a passivation film to expose at least one of the gate pad, the data pad and the common pad; and a driving integrated circuit mounted on a substrate to connect directly to one of the gate pad and the data pad.

15 Claims, 31 Drawing Sheets

U.S. PATENT DOCUMENTS

| | | | |
|---|---|---|---|
| 7,312,470 B2 * | 12/2007 | Byun et al. | 257/59 |
| 2002/0053701 A1 * | 5/2002 | Kong et al. | 257/347 |
| 2002/0067455 A1 * | 6/2002 | Komatsu | 349/141 |
| 2004/0095544 A1 * | 5/2004 | Chang et al. | 349/152 |
| 2007/0263166 A1 * | 11/2007 | Ahn et al. | 349/187 |

FOREIGN PATENT DOCUMENTS

| | | | |
|---|---|---|---|
| JP | 09-244045 | | 9/1997 |
| JP | 2002-196703 | * | 7/2002 |
| JP | 2003-195784 | * | 7/2003 |
| WO | WO 03/001606 | * | 1/2003 |
| WO | WO 03/036374 | * | 5/2003 |

* cited by examiner

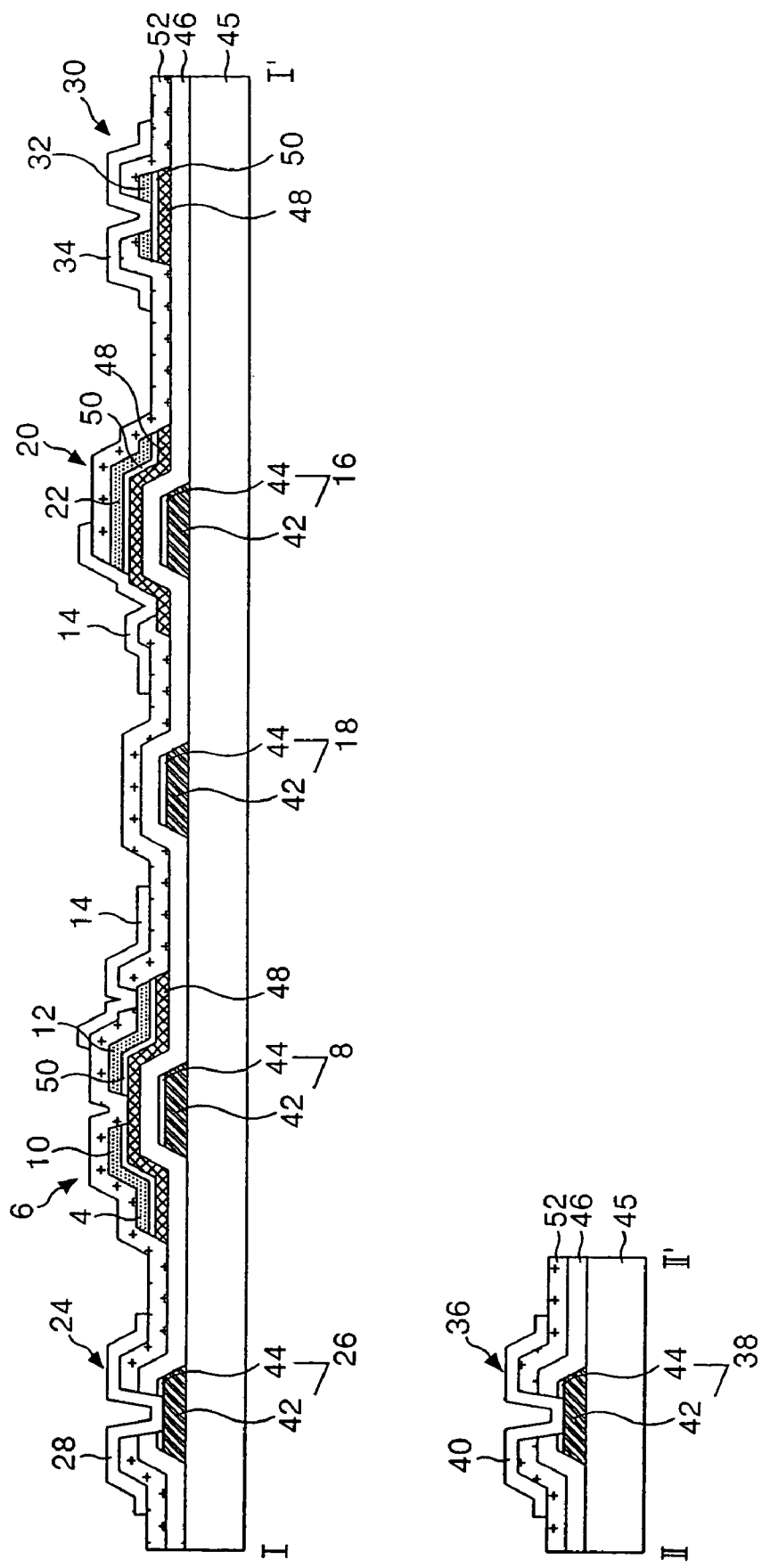

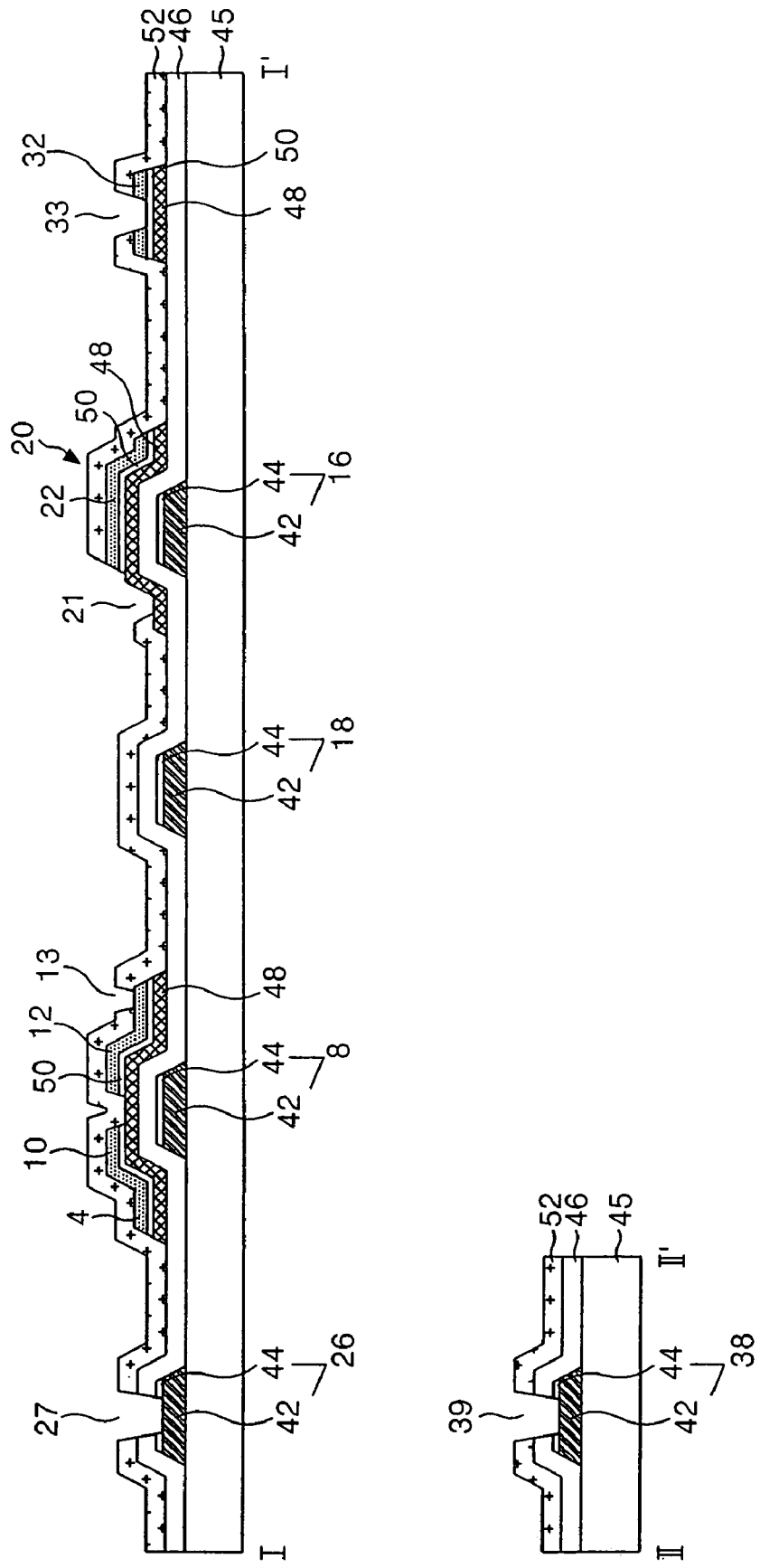

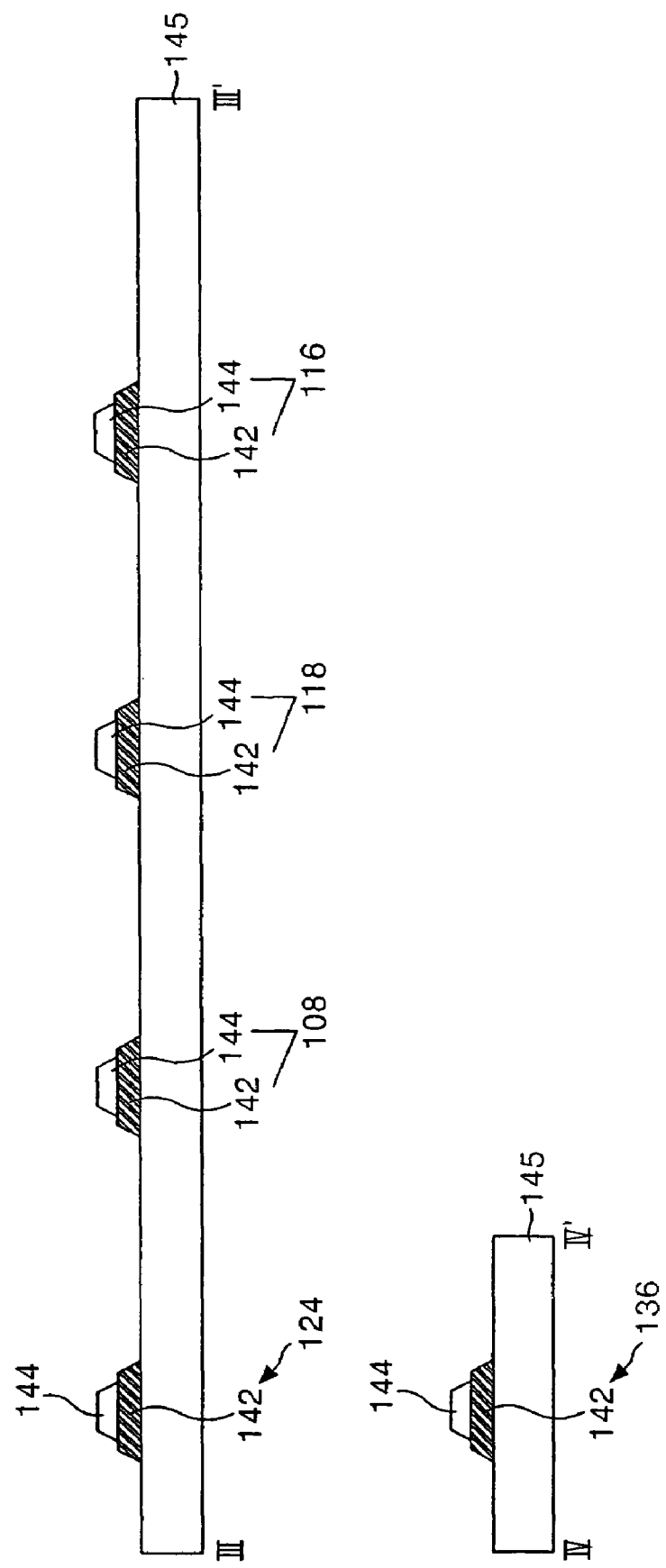

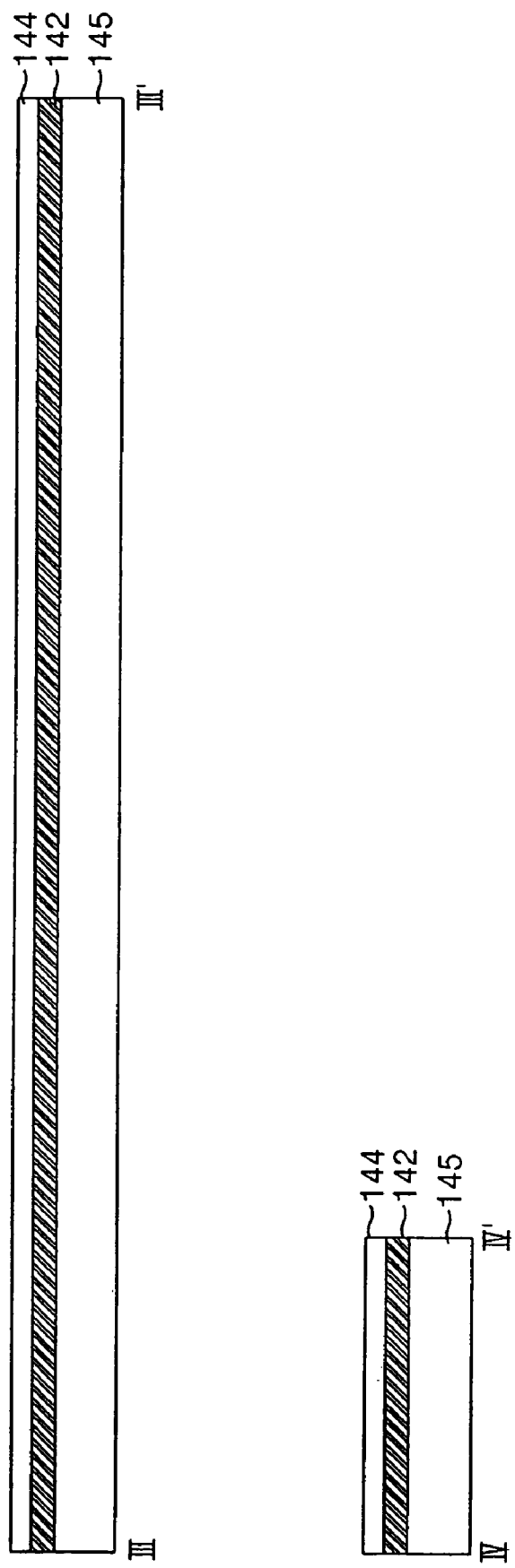

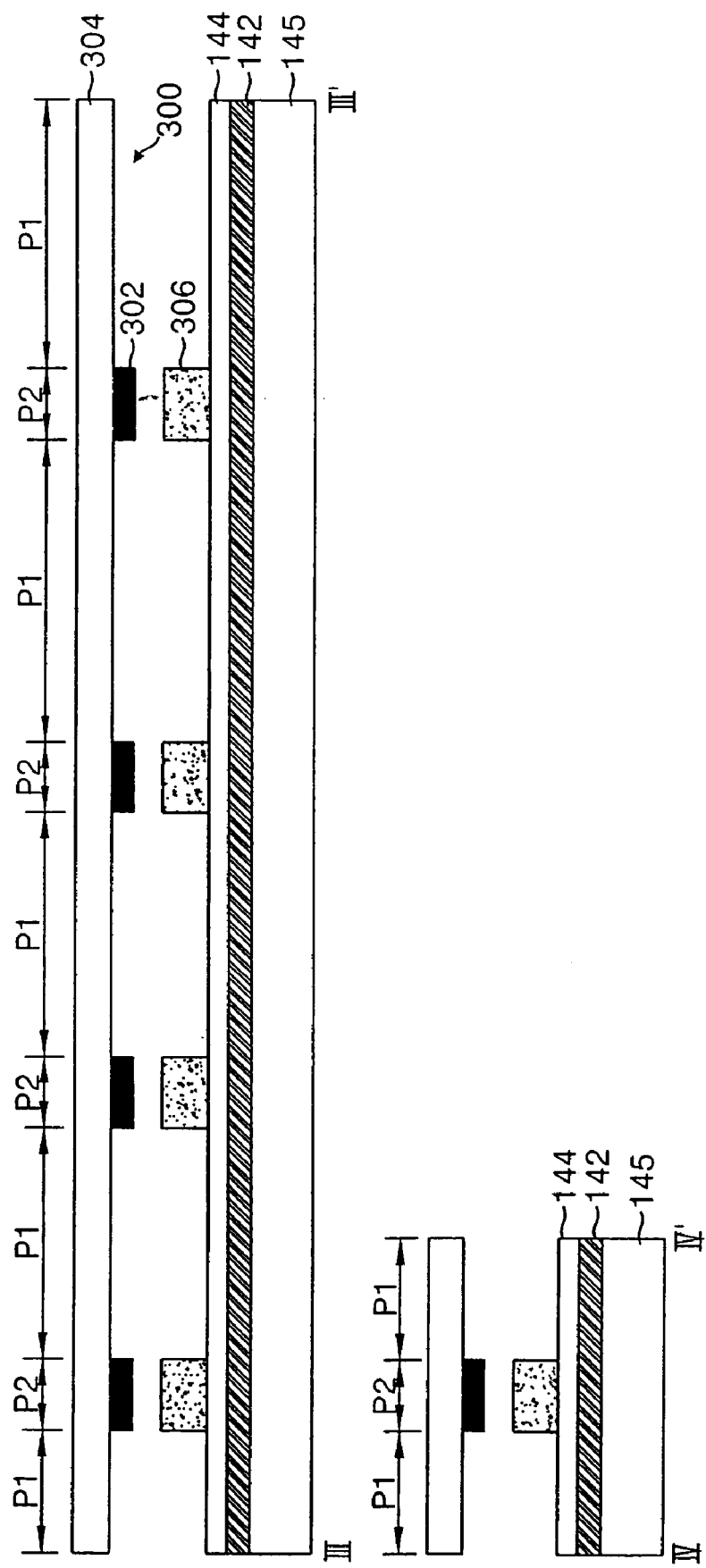

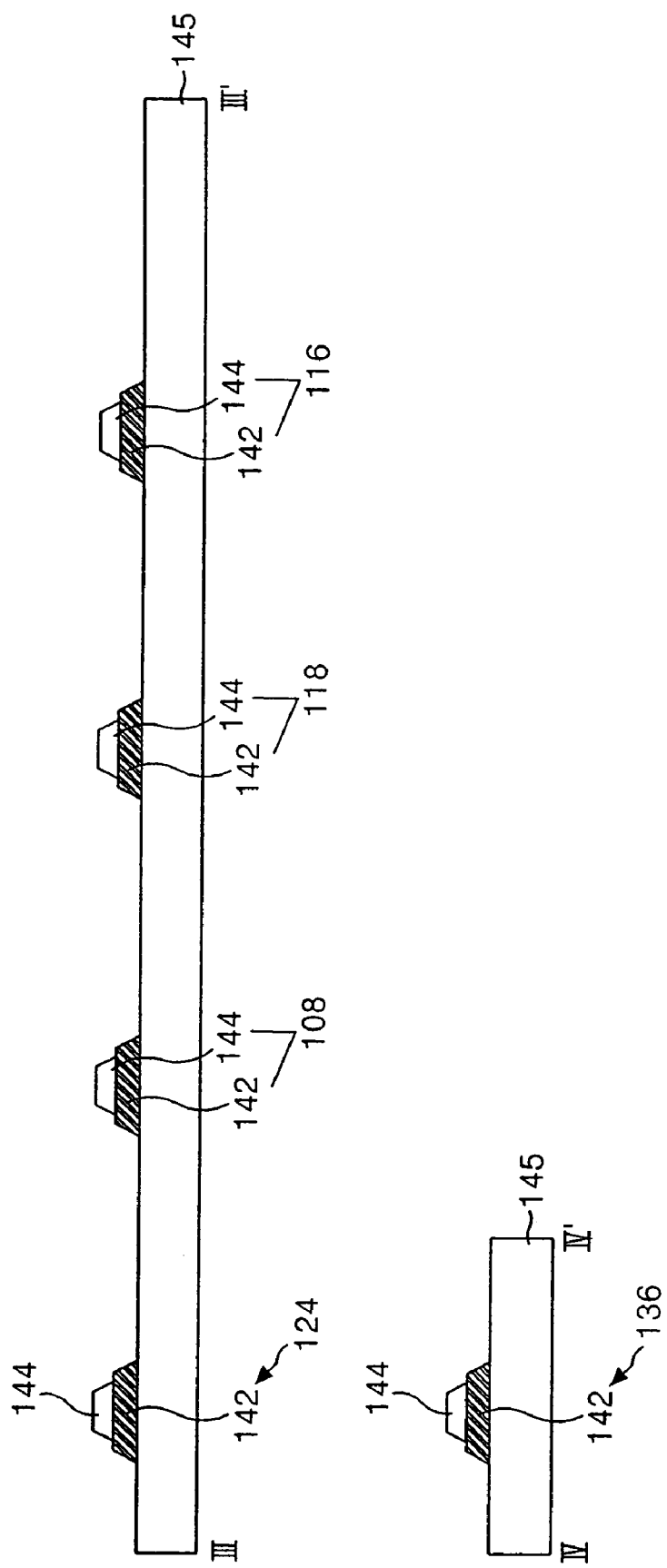

FIG.9A
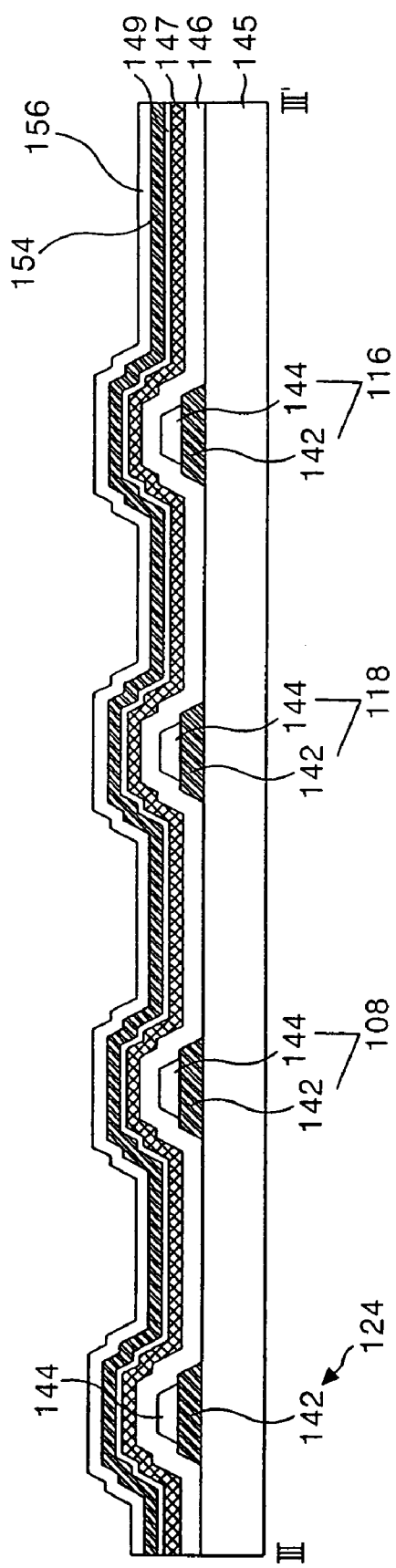
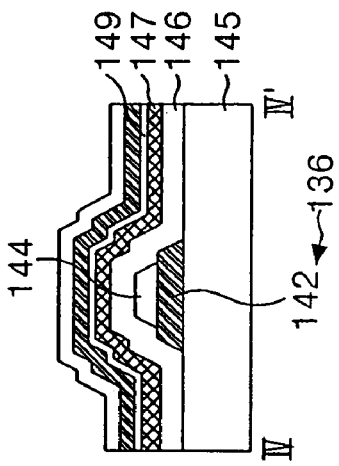

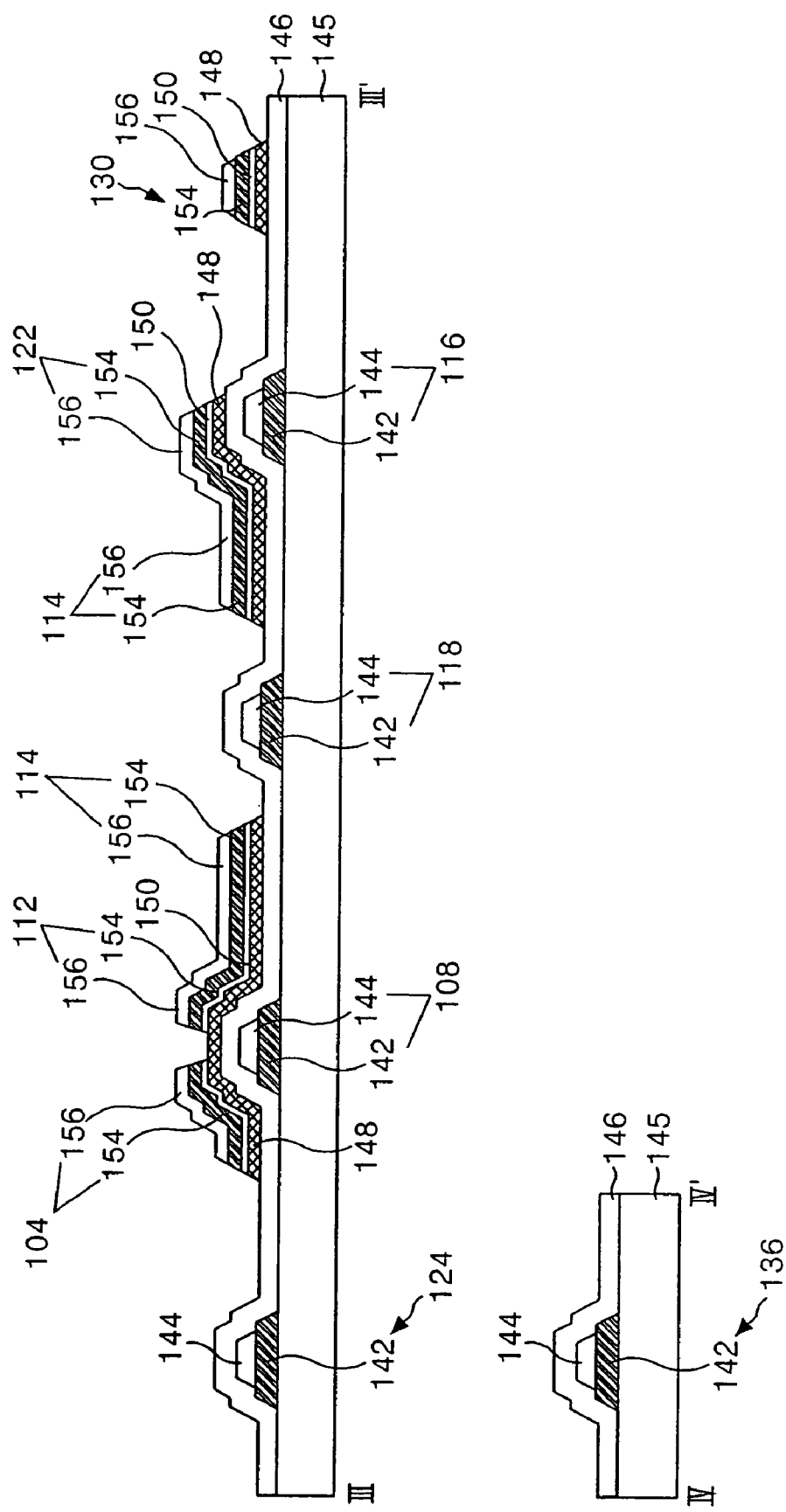

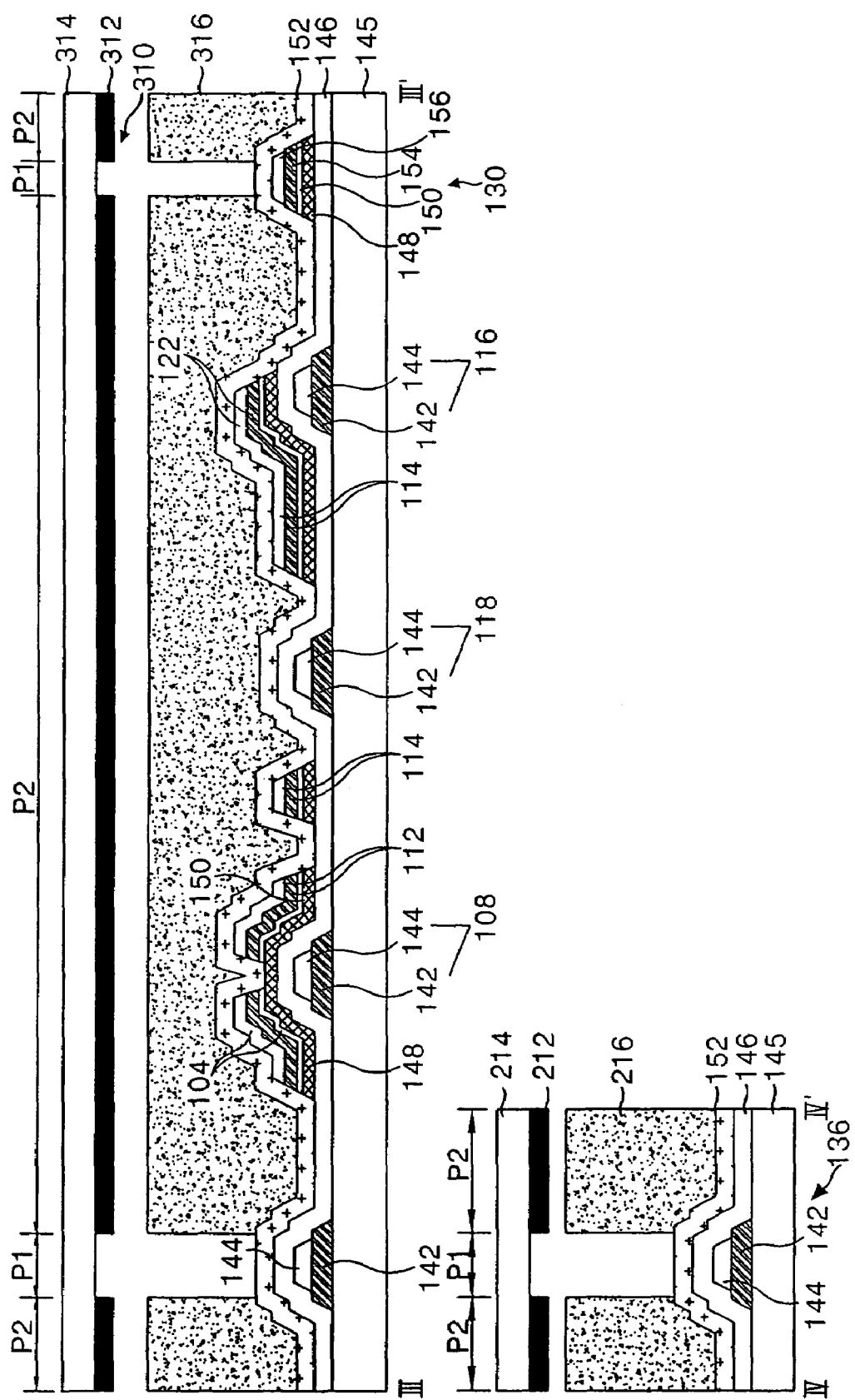

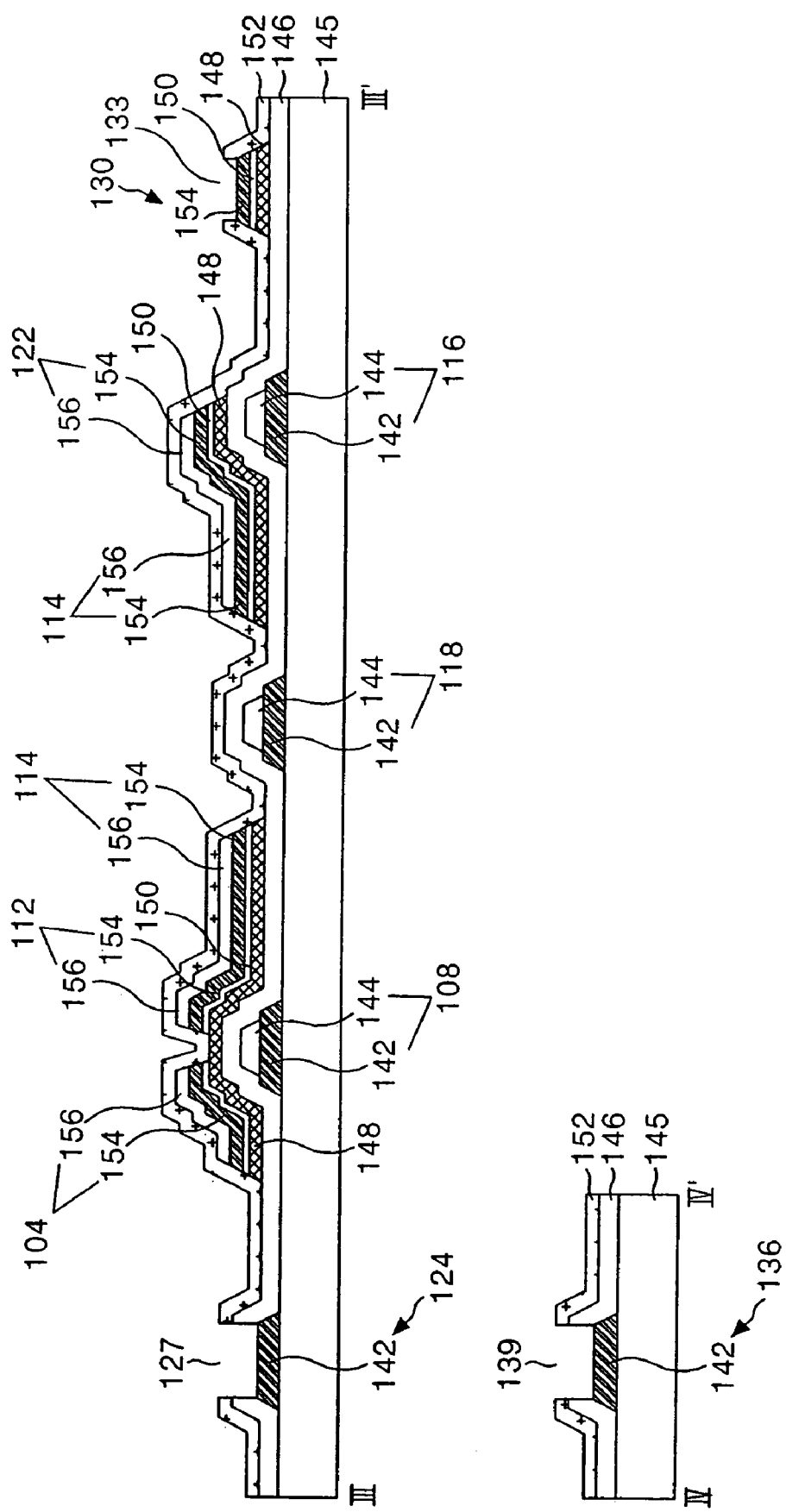

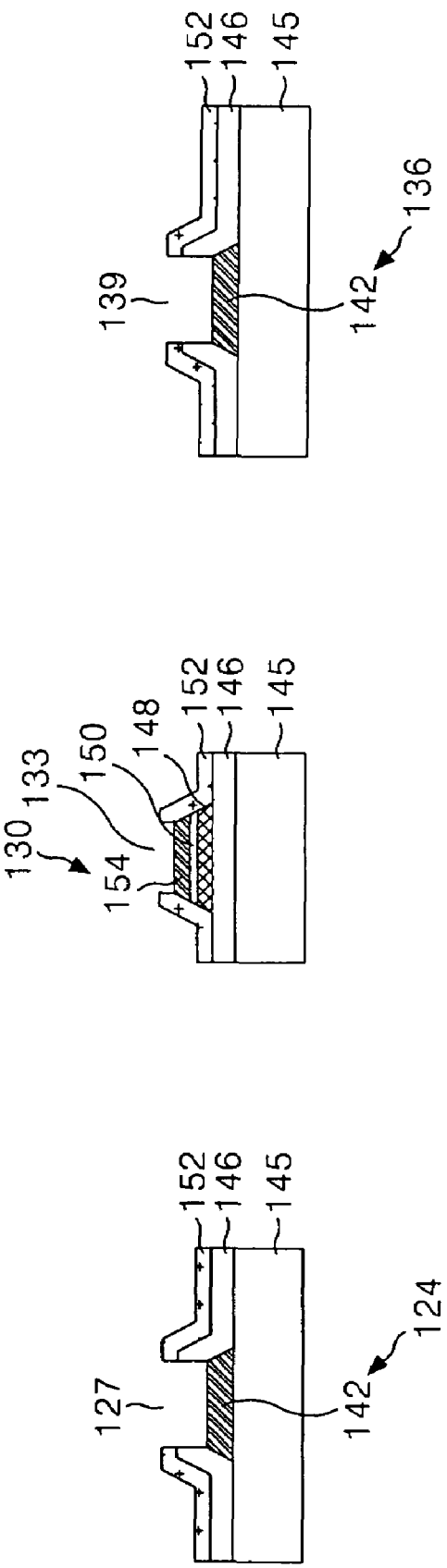

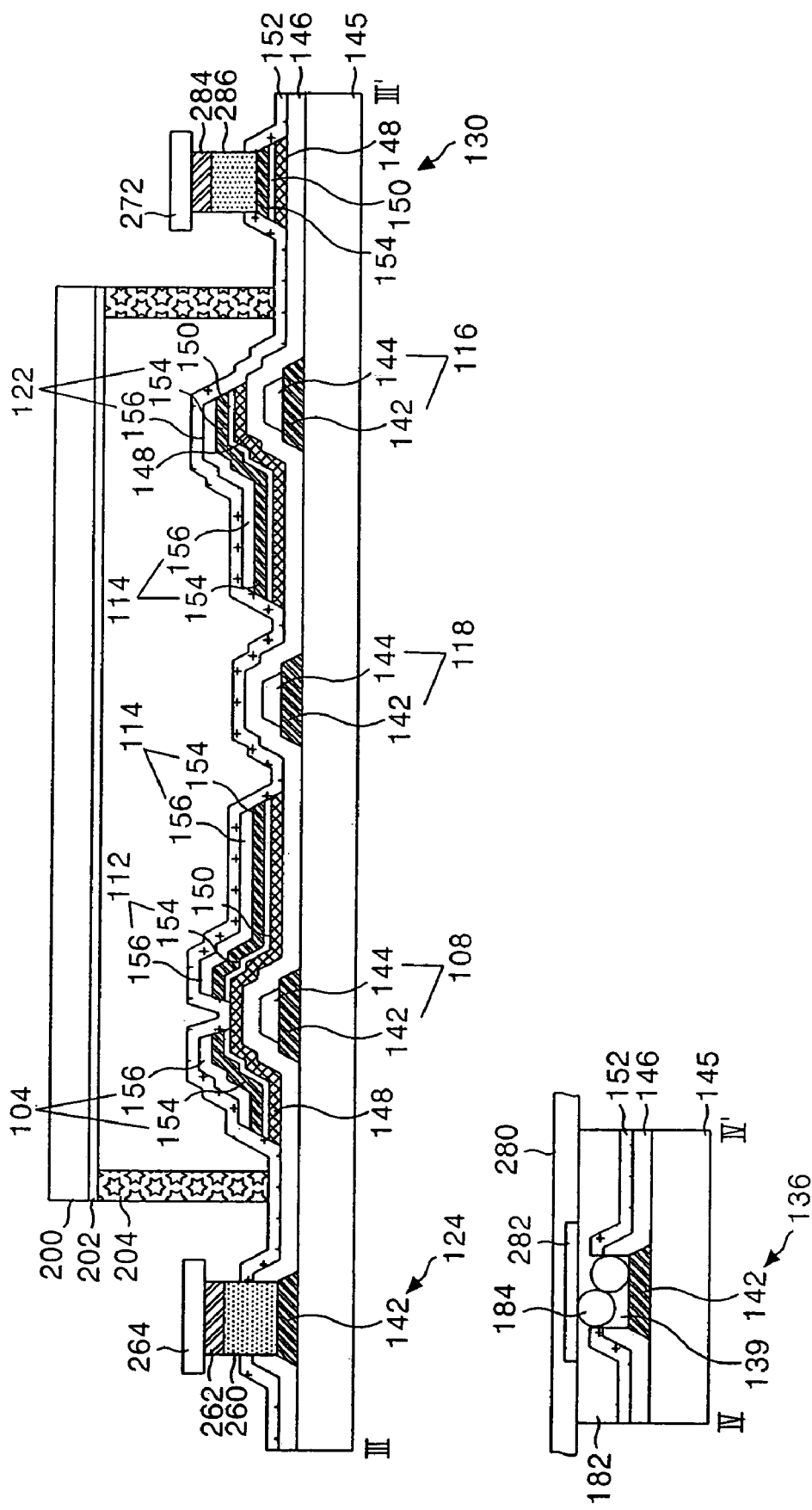

FABRICATING METHOD FOR A LIQUID CRYSTAL DISPLAY OF HORIZONTAL ELECTRIC FIELD APPLYING TYPE

This application is a divisional of application Ser. No. 10/815,843, filed Apr. 2, 2004, now U.S. Pat. 7,132,689 now allowed, which claims priority to Korean Patent Application No. P2003-21116, filed Apr. 3, 2003, each of which are incorporated by reference for all purposes as if fully set forth herein.

BACKGROUND OF THE INVENTION

1. Field of the Invention

The present invention relates to a liquid crystal display having a horizontal electric field. More particularly, the present invention relates to a liquid crystal display and a method of fabricating the same that are capable of reducing the number of mask processes.

2. Discussion of the Related Art

Generally, liquid crystal displays (LCDs) control light transmittance of liquid crystal material using an electric field to display a picture. Liquid crystal displays may be classified as a vertical electric field type or a horizontal electric field type based upon a direction of the electric field that drives the liquid crystal.

The liquid crystal display having a vertical electric field, in which a common electrode formed on an upper substrate and a pixel electrode formed on a lower substrate are arranged to face each other, drives a liquid crystal of a twisted nematic mode (TN) by applying a vertical electric field formed between the common electrode and the pixel electrode. The liquid crystal display having the vertical electric field has an advantage of a large aperture ratio, but has a narrow viewing angle of about 90°.

The liquid crystal display having a horizontal electric field drives a liquid crystal of an in plane switch (hereinafter referred to as "IPS") mode by applying a horizontal electric field between the pixel electrode and the common electrode disposed in parallel on the lower substrate. The liquid crystal display having the applied horizontal electric field has an advantage of an wide viewing angle of about 160°. Hereinafter, the liquid crystal display having the applied horizontal electric field will be described in detail.

The liquid crystal display having the horizontal electric field includes a thin film transistor array substrate (a lower substrate) and a color filter array substrate (an upper substrate) that face and are joined together, a spacer to uniformly maintain a cell gap between the upper and lower substrates and a liquid crystal injected into a space provided by the spacer.

The thin film transistor array substrate includes a plurality of signal lines for forming a horizontal electric field, a plurality of thin film transistors, and an alignment film applied to align the liquid crystal thereon. The color filter array substrate includes a color filter for representing a color, a black matrix for preventing light leakage and an alignment film applied for liquid crystal alignment thereon.

In such a liquid crystal display, because the thin film transistor array substrate involves a semiconductor process and requires a plurality of mask processes, the manufacturing process is complicated and involves a high rise factor associated with the manufacturing cost of the liquid crystal display panel. In order to ease the problems of the manufacturing process, work has been done to develop a thin film transistor array substrate having a reduced number of mask processes. This is because one mask process includes many processes such as thin film deposition, cleaning, photolithography, etching, photo-resist stripping and inspection processes, etc. Recent development has produced a four-round mask process in which one mask process is reduced from the existent five-round mask process that is employed as a standard mask process.

FIG. 1 is a plan view illustrating a related art thin film transistor substrate having a horizontal electric field using the four-round mask process, and FIG. 2 is a sectional view of the thin film transistor array substrate taken along the I-I' and II-II' line in FIG. 1.

Referring to FIGS. 1 and 2, the related art thin film transistor array substrate having a horizontal electric field includes a gate line 2 and a data line 4 formed on a lower substrate 45 in such a manner as to cross each other, a thin film transistor 6 formed at each crossing, a pixel electrode 14 and a common electrode 18 formed such that the horizontal electric field is applied in a pixel region defined by the crossing and a common line 16 connected to the common electrode 18. Further, the related art thin film transistor array substrate includes a storage capacitor 20 formed at an overlapped portion between the pixel electrode 14 and the common line 16, a gate pad 24 connected to the gate line 2, and a data pad 30 connected to the data line 4 and a common pad 36 connected to the common line 16.

The gate line 2 supplies a gate signal to the gate electrode 8 of the thin film transistor 6. The data line 4 supplies a pixel signal to the pixel electrode 14 via a drain electrode 12 of the thin film transistor 6. The gate line 2 and the data line 4 cross to define the pixel region 5.

The common line 16 is formed in parallel to the gate line 2 in the pixel region 5 and is positioned to supply a reference voltage for driving the liquid crystal to the common electrode 18.

The thin film transistor 6 responds to the gate signal of the gate line 2 so that the pixel signal of the data line 4 is charged to the pixel electrode 14. To this end, the thin film transistor 6 includes a gate electrode 8 connected to the gate line 2, a source electrode 10 connected to the data line 4 and a drain electrode 12 connected to the pixel electrode 14. Further, the thin film transistor 6 includes an active layer 48 overlapping the gate electrode 8 with a gate insulating film 46 positioned between the thin film transistor 6 and the gate electrode 8 and defining a channel between the source electrode 10 and the drain electrode 12. On the active layer 48, an ohmic contact layer 50 for making an ohmic contact with the data line 4, the source electrode 10, the drain electrode 12, the data pad lower electrode 32 and the storage electrode 22 is further formed.

The pixel electrode 14, which is connected to the drain electrode 12 of the thin film transistor 6 via a first contact hole 13 passing through a passivation film 52, is formed in the pixel region 5. Particularly, the pixel electrode 14 includes a first horizontal part 14A connected to the drain electrode 12 and formed in parallel with adjacent gate line 2 and a second horizontal part 14B formed to overlap with the common line 16 and a finger part 14C formed in parallel with the common electrode 18.

The common electrode 18 is connected to the common line 16 and is formed in the pixel region 5. In addition, the common electrode 18 is formed in parallel with the finger part 14C of the pixel electrode 14 in the pixel region 5.

A horizontal electric field is applied between the pixel electrode 14, to which the pixel signal is supplied via the thin film transistor 6, and the common electrode 18, to which the reference voltage is supplied via the common line 16. Moreover, the horizontal electric field is applied between the finger part 14C of the pixel electrode 14 and the common electrode 18. The liquid crystal molecules arranged in the horizontal direction between the thin film transistor array substrate and the color filter array substrate by the horizontal electric field rotate due to a dielectric anisotropy. The light transmittance of the pixel region 5 differs based upon the amount of rotation of the liquid crystal molecules and thereby the pictures can be represented.

The storage capacitor 20 consists of the common line 16, a storage electrode 22 that overlaps with the common line 16 and the gate insulating film 46, the active layer 48 and the ohmic contact layer 50 positioned therebetween, and a pixel electrode 14 connected via a second contact hole 21 passing through the storage electrode 22 and the passivation film 52. The storage capacitor 20 allows a pixel signal charged in the pixel electrode 14 to be maintained until the next pixel signal is charged.

The gate line 2 is connected, via the gate pad 24, to a gate driver (not shown). The gate pad 24 consists of a gate pad lower electrode 26 extended from the gate line 2, and a gate pad upper electrode 28 connected, via a third contact hole 27 passing through the gate insulating film 46 and the passivation film 52, to the gate pad lower electrode 26.

The data line 4 is connected, via the data pad 30, to the data driver (not shown). The data pad 30 consists of a data pad lower electrode 32 extended from the data line 4, and a data pad upper electrode 34 connected, via a fourth contact hole 33 passing through the passivation film 52, to the data pad lower electrode 32.

The common line 16 supplied with the reference voltage from an exterior reference voltage source (not shown) via the common pad 36. The common pad 36 consists of a common pad lower electrode 38 extended from the common line 16, and a common pad upper electrode 40 connected, via a fifth contact hole 39 passing through the gate insulating film 46 and the passivation film 52, to the common pad lower electrode 38.

A method of fabricating a thin film transistor substrate having the above-mentioned structure using a four-round mask process will be described in detail with reference to FIGS. 3A to 3D.

In FIG. 3A, a first conductive pattern group including the gate line 2, the gate electrode 8 and the gate pad lower electrode 26 is formed on the lower substrate 45 using the first mask process.

Specifically, a first metal layer 42 and a second metal layer 44 are sequentially formed on the lower substrate 45 by a deposition technique such as sputtering to form a gate metal layer having a double-structure. Then, the gate metal layer is patterned by a photolithography and etching process using a first mask to form the first conductive pattern group including the gate line 2, the gate electrode 8, the gate pad lower electrode 26, the common line 16, common electrode 18 and the common pad lower electrode 38. The first metal layer 42 is formed with an aluminum system metal and the second metal layer 44 is formed with a chrome (Cr) or a molybdenum (Mo).

Referring to FIG. 3B, the gate insulating film 46 is formed on the lower substrate 45 provided with the first conductive pattern group. Further, a semiconductor pattern group including the active layer 48 and the ohmic contact layer 50 and a second conductive pattern group including the data line 4, the source electrode 10, the drain electrode 12, the data pad lower electrode 32 and the storage electrode 22 are formed on the gate insulating film 46 using the second mask process.

More specifically, the gate insulating film 46, a first semiconductor layer, a second semiconductor layer and a data metal layer are sequentially formed on the lower substrate 45 provided with the first conductive pattern group by deposition techniques such as the plasma enhanced chemical vapor deposition (PECVD) and the sputtering, etc. The gate insulating film 46 is made of an inorganic insulating material such as silicon oxide (SiOx) or silicon nitride (SiNx). The first semiconductor layer is made of amorphous silicon in which an impurity is not doped and the second conductor layer is made of amorphous silicon that an impurity of a N type or P type is doped. The data metal layer is made of a molybdenum (Mo), a titanium (Ti), tantalum (Ta) or a molybdenum alloy, etc.

Then, a photo-resist pattern is formed on the data metal layer by photolithography using a second mask. In this case, a diffractive exposure mask having a diffractive exposing part at a channel portion of the thin film transistor is used as a second mask, allowing a photo-resist pattern of the channel portion to have a lower height than other photo-resist patterns of region portions.

Subsequently, the data metal layer is patterned by a wet etching process using the other photo-resist patterns to provide the data pattern including the data line 4, the source electrode 10, the drain electrode 12 being integral to the source electrode 10 and the storage electrode 22.

Next, the first semiconductor layer and the second semiconductor layer are patterned at the same time by a dry etching process using the same photo-resist pattern to provide the ohmic contact layer 50 and the active layer 48.

The photo-resist pattern having a relatively low height is removed from the channel portion by an ashing process and thereafter the source electrode, the drain electrode and the ohmic contact layer 50 of the channel portion are etched by the dry etching process. Thus, the active layer 48 of the channel portion is exposed to separate the source electrode 10 from the drain electrode 12.

Then, a remainder of the photo-resist pattern on the second conductive pattern group is removed using the stripping process.

Referring to FIG. 3C, the passivation film 52 including first to fifth contact holes 13, 21, 27, 33 and 39 are formed on the gate insulating film 46 provided with the second conductive pattern group using a third mask process.

More specifically, the passivation film 52 is entirely formed on the gate insulating film 46 provided with the data pattern by a deposition technique such as plasma enhanced chemical vapor deposition (PECVD). The passivation film 52 is patterned by the photolithography and the etching process using the third mask to form first to fifth contact holes 13, 21, 27, 33 and 39. The first contact hole 13 is formed in such a manner to pass through the passivation film 52 and expose the drain electrode 12, whereas the second contact hole 21 is formed in such a manner as to pass through the passivation film 52 and expose the storage electrode 22. The third contact hole 27 is formed in such a manner as to pass through the passivation film 52 and the gate insulating film 46 and expose the gate pad lower electrode 26, whereas the fourth contact hole 33 is formed in such a manner as to pass through the passsivation film 52 and expose the data pad lower electrode 32, and the fifth contact hole 39 is formed in such a manner as to pass through the passivation film 52 and the gate insulating film 46 and expose the common pad lower electrode 38. Herein, when a metal, which has a high ratio of dry etching like a molybdenum (Mo), is used for the data metal, the first contact hole 13, the second contact hole 21 and the forth contact hole 33 are formed in such a manner to pass through to the drain electrode 12, the storage electrode 22 and the data pad lower electrode 32, respectively, to expose their side.

The passivation film 52 is made of an inorganic insulating material such as the gate insulating film 46 or an organic insulating material having a small dielectric constant such as an acrylic organic compound, BCB (benzocyclobutene) or PFCB (perfluorocyclobutane), etc.

In FIG. 3D, a third conductive pattern group including the pixel electrode 14, the gate pad upper electrode 28, the data pad upper electrode 34 and the common pad upper electrode 40 is formed on the passivation film 52 using the fourth mask process.

More specifically, a transparent conductive film is coated on the passivation film 52 using a deposition technique such as the sputtering, etc. Then, the transparent conductive film is patterned by the photolithography and the etching process using a fourth mask, to provide the third conductive pattern group including the pixel electrode 14, the gate pad upper electrode 28, the data pad upper electrode 34 and the common pad upper electrode 40. The pixel electrode 14 is electrically connected, via the first contact hole 13, to the drain electrode 12 while being electrically connected, via the second contact hole 21, to the storage electrode 22. The gate pad upper electrode 28 is electrically connected, via the third contact hole 37, to the gate pad lower electrode 26. The data pad upper electrode 34 is electrically connected, via the fourth contact hole 33, to the data pad lower electrode 32. The common pad upper electrode 40 is electrically connected, via the fifth contact hole 39, to the common pad lower electrode 38.

In this connection, the transparent conductive film may be made of an indium-tin-oxide (ITO), a tin-oxide (TO), an indium-zinc-oxide (IZO) or an indium tin zinc oxide (ITZO).

As described above, the related art thin film transistor array substrate having a horizontal electric field and the manufacturing method thereof uses a four-round mask process. Thus, the number of manufacturing processes is reduced in comparison to a five-round mask process, and hence manufacturing costs are also reduced. However, because the four-round mask process still has a complex manufacturing process, there is a need to further simplify the manufacturing process and reduce the manufacturing costs more.

SUMMARY OF THE INVENTION

Accordingly, the present invention is directed to a liquid crystal display having an applied horizontal electric field and a method of fabricating the same that substantially obviates one as more of the problems due to limitations and disadvantages of the related art An advantage of the present invention is to provide a liquid crystal display device and method that reduces the number of mask processes.

To achieve this and other advantages and in accordance with the invention as embodied and broadly described, the liquid crystal display having an applied horizontal electric field includes: a gate line; a common line substantially parallel to the gate line; a data line arranged to cross the gate line and the common line to define a pixel area; a thin film transistor formed at each crossing of the gate line and the data line; a common electrode formed in the pixel area and connected to the common line; a pixel electrode connected to the thin film transistor, wherein the horizontal electric field is formed between the pixel electrode and the common electrode in the pixel area; a gate pad formed with at least one conductive layer included in the gate line; a data pad formed with at least one conductive layer included in the data line; a common pad formed with at least one conductive layer included in the common line; a passivation film to expose at least one of the gate pad, the data pad and the common pad; and a driving integrated circuit mounted on a substrate directly connected to one of the gate pad and the data pad.

In another aspect of the present invention, a method for fabricating a liquid crystal display having a horizontal electric field includes: preparing a thin film transistor array substrate having a gate line and a data line, wherein a thin film transistor formed at a crossing of the gate line and the data line, wherein the horizontal electric field is formed between a pixel electrode connected to the thin film transistor and a common electrode forming a conductive layer in a gate pad, a data pad, and a common pad, wherein at least one of the gate pad, data pad and common pad is exposed through a passivation layer, and mounting a driving integrated circuit on the substrate, wherein at least one of the exposed gate pad and the data pad is directly connected to the driving integrated circuit.

It is to be understood that both the foregoing general description and the following detailed description are exemplary and explanatory and are intended to provide further explanation of the invention as claimed.

BRIEF DESCRIPTION OF THE DRAWINGS

These and other objects of the invention will be apparent from the following detailed description of the embodiments of the present invention with reference to the accompanying drawings, in which:

FIG. 2 is a sectional view of the thin film transistor array substrate taken along the lines I-I' and II-II' in FIG. 1;

FIGS. 3A to 3D are sectional views sequentially illustrating a method of manufacturing the thin film transistor array substrate shown in FIG. 2;

FIG. 6A and FIG. 6B are a plan view and a sectional view for explaining a first mask process among a manufacturing method of a thin film transistor array substrate according to an embodiment of the present invention, respectively;

FIGS. 7A to 7C are sectional views for illustrating the first mask process of the manufacturing method of a thin film transistor array substrate according to an embodiment of the present invention;

FIGS. 9A to 9E are sectional views for illustrating the second mask process of the manufacturing method of the thin film transistor array substrate according to an embodiment of the present invention;

FIGS. 11A to 11C are sectional views illustrating the third mask process of the manufacturing method of the thin film transistor array substrate according to an embodiment of the present invention;

FIG. 12 is a sectional view showing pads of a first structure of the thin film transistor substrate according to an embodiment of the present invention;

FIG. 17 is a sectional view of the liquid crystal display shown in FIG. 16.

DETAILED DESCRIPTION OF THE ILLUSTRATED EMBODIMENTS

Reference will now be made in detail to an embodiment of the present invention, example of which is illustrated in the accompanying drawings.

Figure 1:
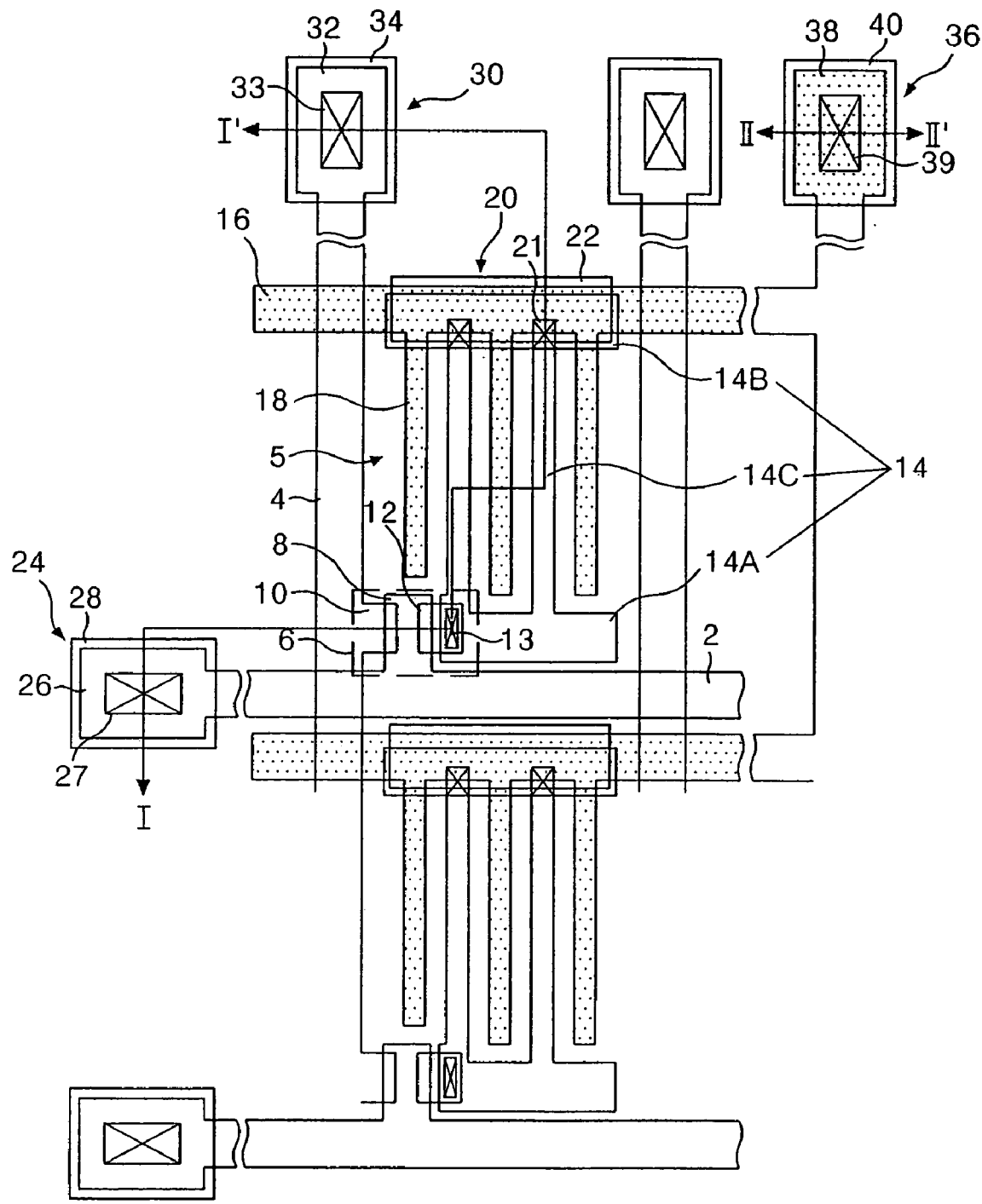
FIG. 1 is a plan view showing a related art thin film transistor array substrate of a liquid crystal display having an applied horizontal electric field.
Figure 3A:
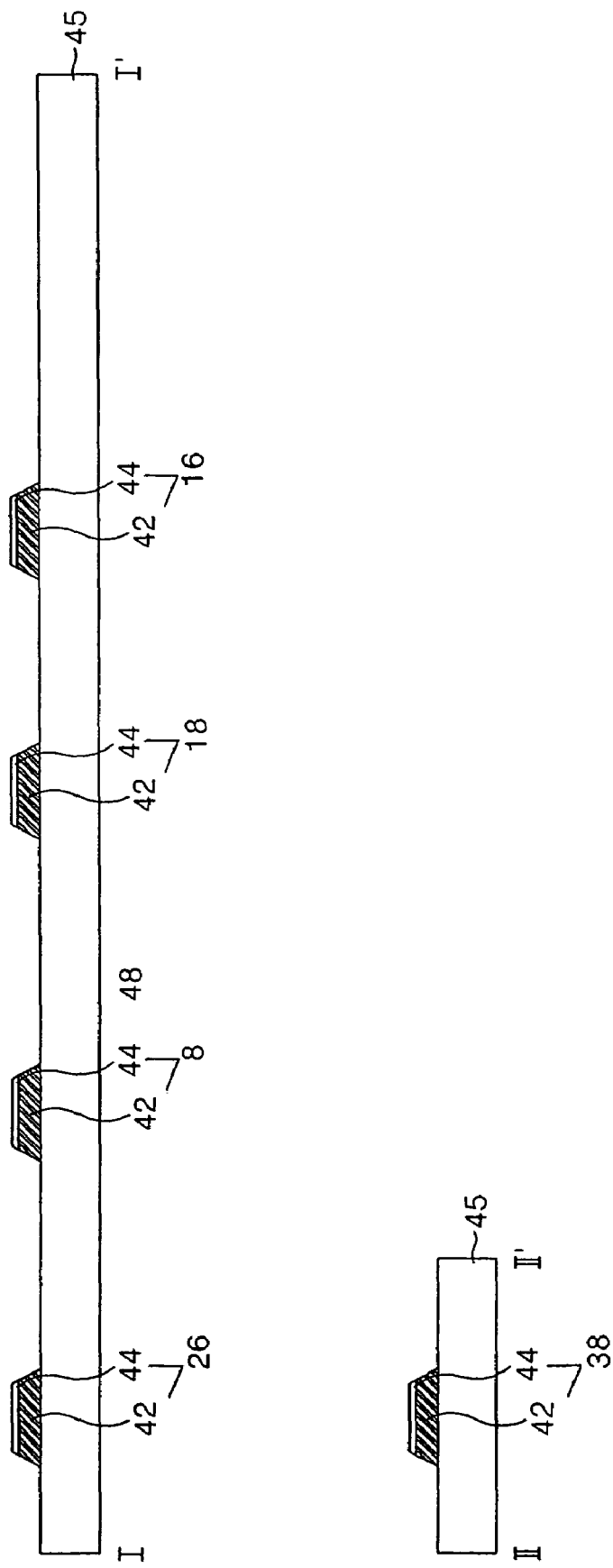
Figure 3B:
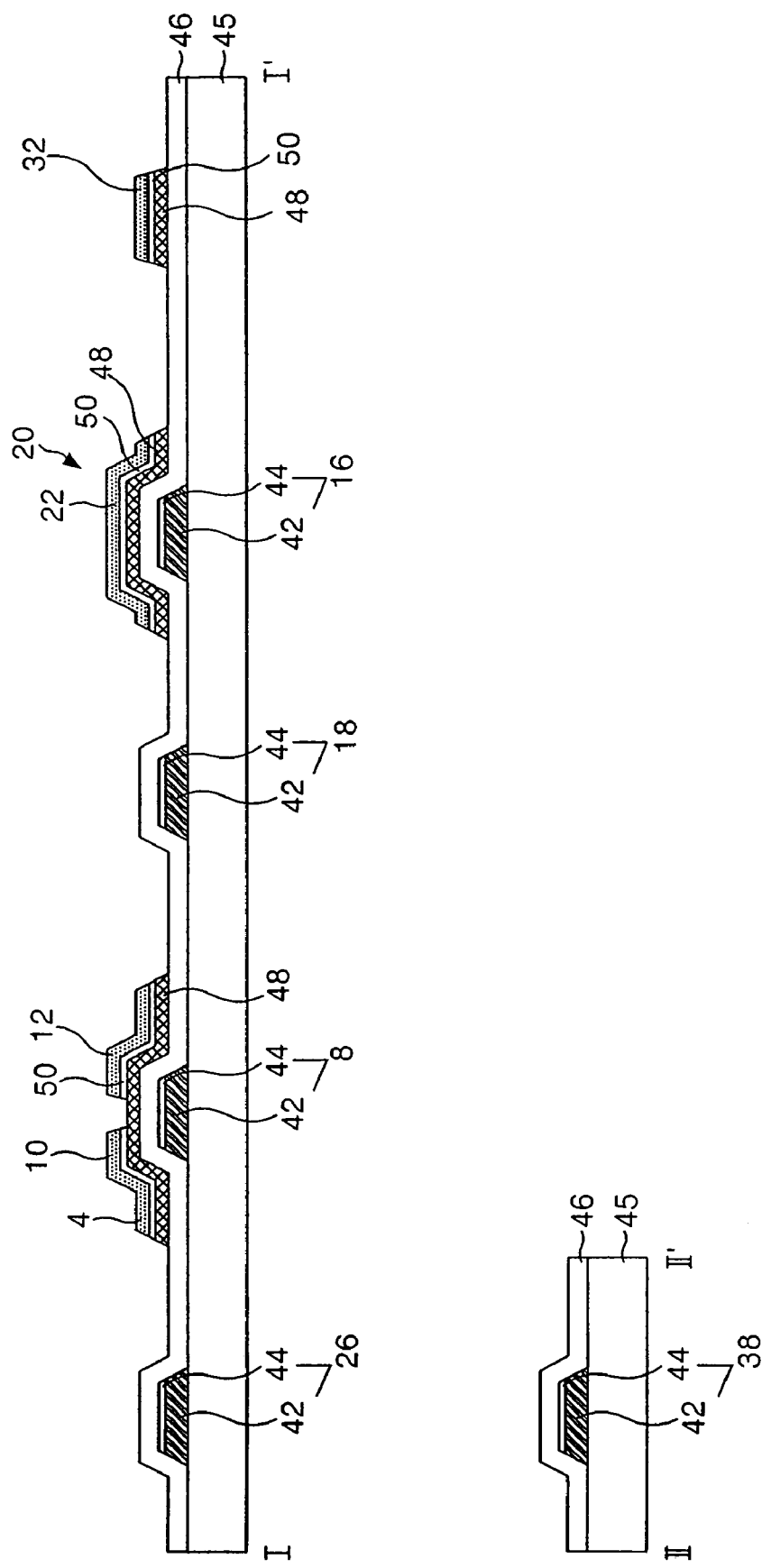
Figure 3D:
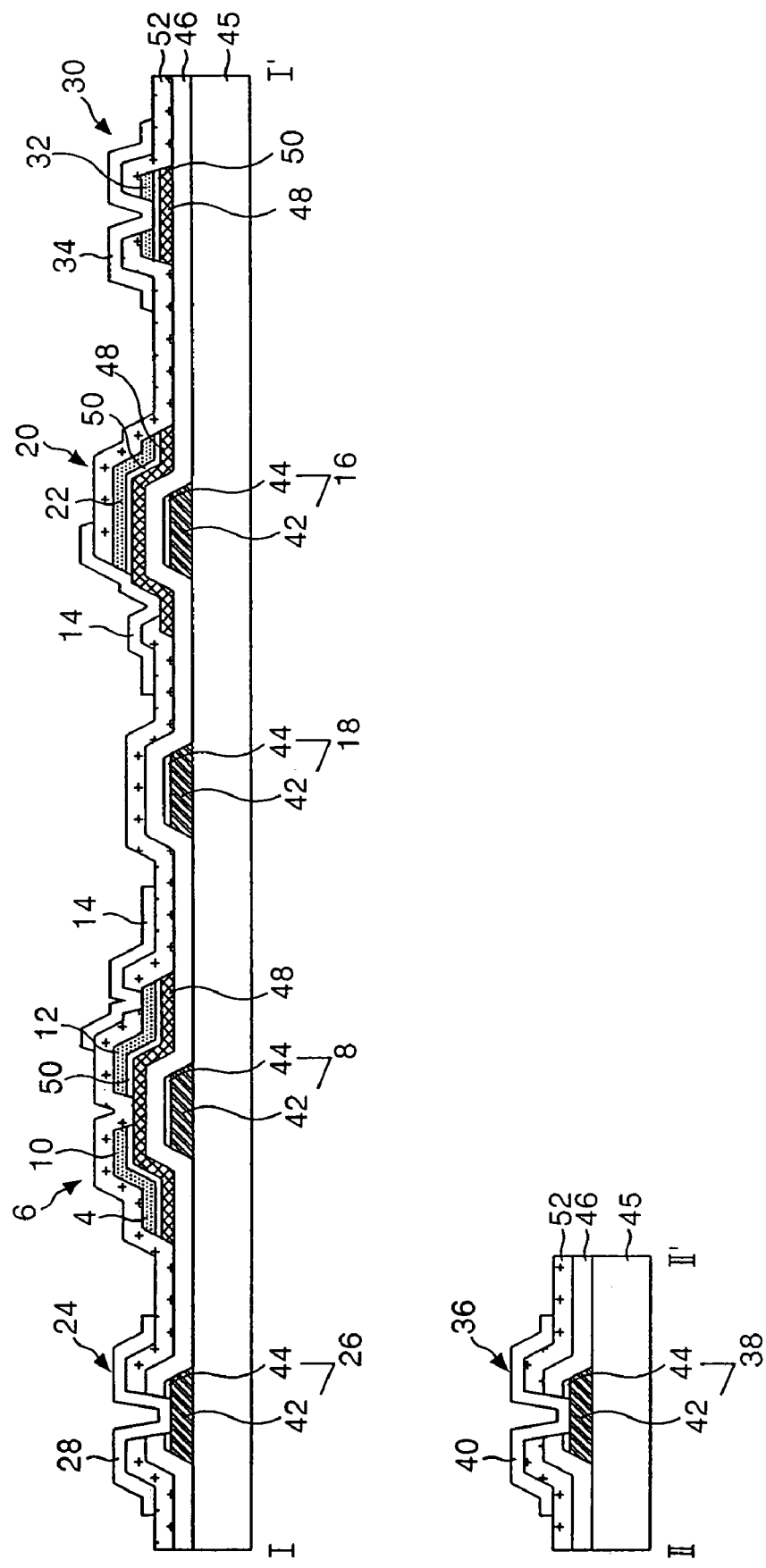
Figure 4:
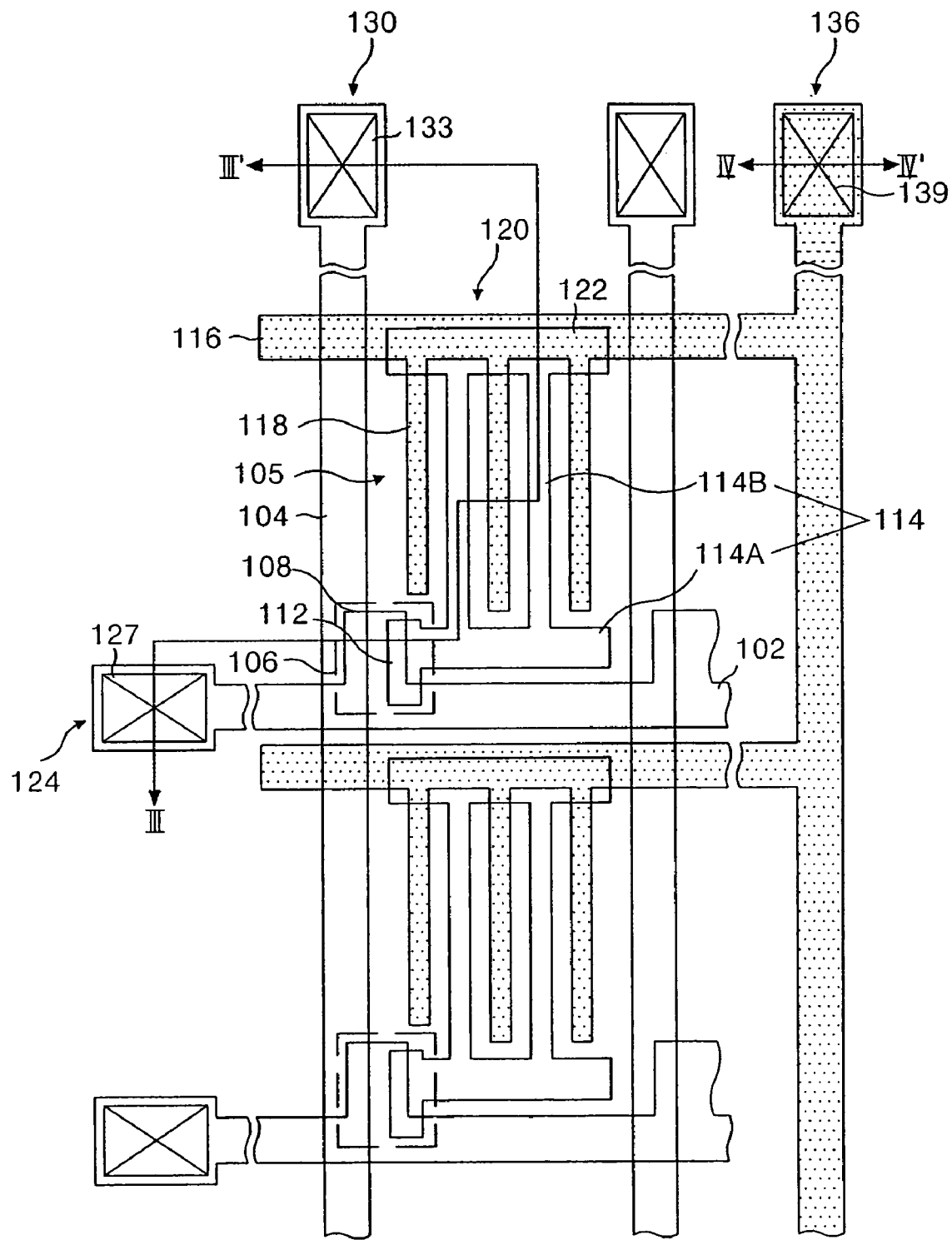
FIG. 4 is a plan view showing a thin film transistor array substrate of the liquid crystal display having an applied horizontal electric field according to an embodiment of the present invention.
Figure 5:
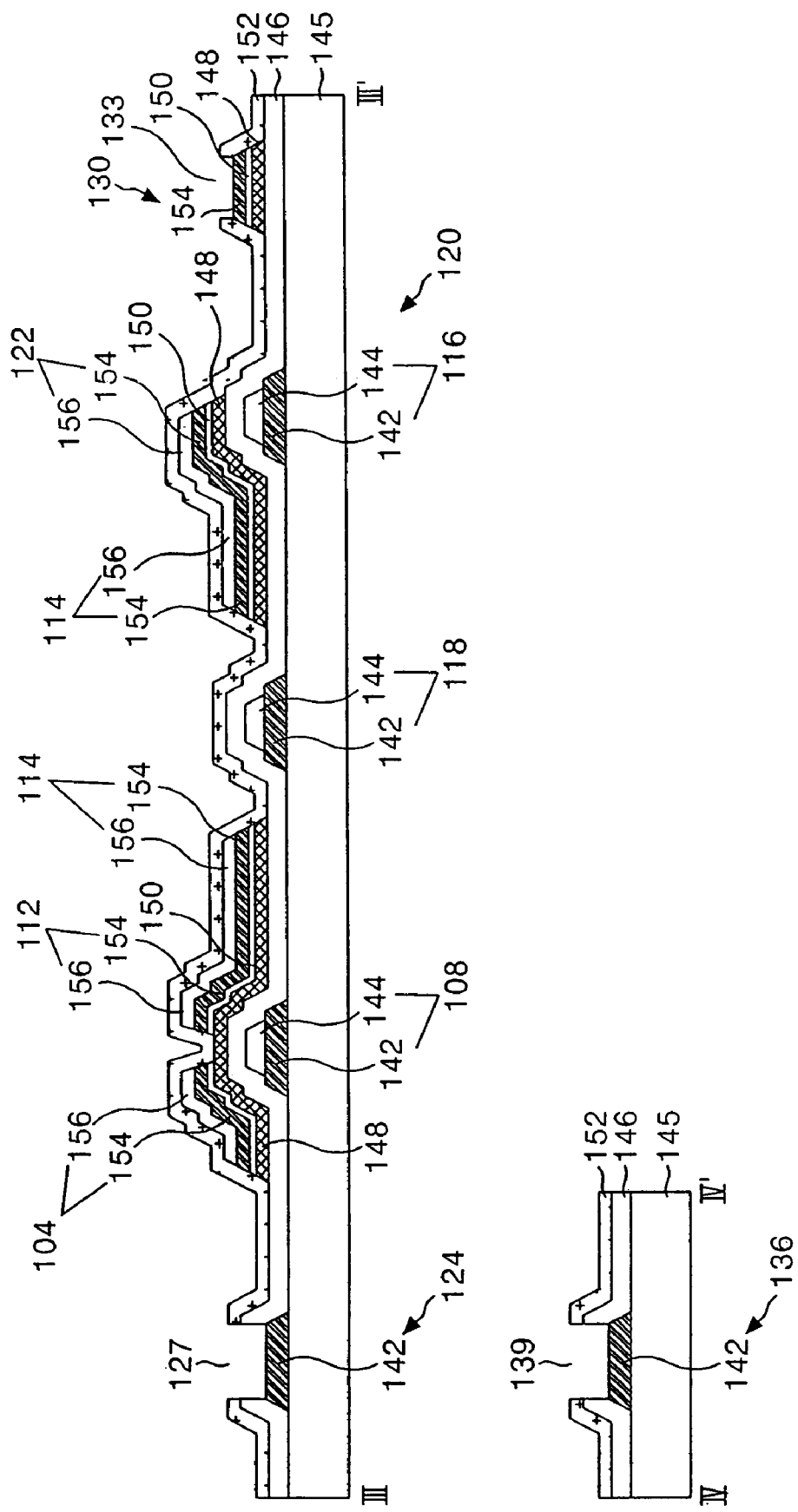
FIG. 5 is a sectional view of the thin film transistor array substrate taken along the lines III-III' and IV-IV' in FIG. 4.

FIG. 4 is a plan view illustrating a thin film transistor array substrate of a liquid crystal display having an applied horizontal electric field according to an embodiment of the present invention, and FIG. 5 is a sectional view of the thin film transistor array substrate taken along the lines III-III' and IV-IV' of FIG. 4.

In FIGS. 4 and 5, the thin film transistor array substrate includes a gate line 102 and a data line 104, which have a gate insulating film 146 therebetween, formed on a lower substrate 145 in such a manner as to cross each other, a thin film transistor 106 formed at each crossing of the gate line 102 and the data line 104, a pixel electrode 114 and a common electrode 118 formed in order to apply the horizontal electric field in a pixel region defined by the interconnection and a common line 116 connected to the common electrode 118. Further, the thin film transistor array substrate includes a storage capacitor 120 formed at an overlapped portion between an upper storage electrode 122 and the common line 116, a gate pad 124 extended from the gate line 102, and a data pad 130 extended from the data line 104 and a common pad 136 extended from the common line 116.

The gate line 102 for supplying a gate signal and the data line 104 for supplying a data signal are formed in a crossing structure to thereby define a pixel region 105.

The common line 116 supplies a reference voltage for driving the liquid crystal and is formed in parallel to the gate line 102 within the pixel region 105.

The thin film transistor 106 responds to the gate signal of the gate line 102 so that the pixel signal of the data line 104 is charged and maintained in the pixel electrode 114. To this end, the thin film transistor 106 includes a gate electrode 108 connected to the gate line 102, a source electrode included in the data line 104 and a drain electrode 112 connected to the pixel electrode 114. Further, the thin film transistor 106 includes an active layer 148 overlapping with the gate electrode 108 with a gate insulating film 146 positioned therebetween and defining a channel between the source electrode and the drain electrode 112.

The active layer 148 is formed to overlap with the data line 104, the data pad 130 and an upper storage electrode 122. On the active layer 148, an ohmic contact layer 150 for making an ohmic contact with the data line 104, the drain electrode 112, the data pad 130 and the upper storage electrode 122 is further provided.

The pixel electrode 114 being integral to the drain electrode 112 of the thin film transistor 106 and the upper storage electrode 122 is formed in the pixel region 105. Particularly, the pixel electrode 114 includes a horizontal part 114A extended in parallel with adjacent gate line 102 from the drain electrode 112 and a finger part 114B extended from the horizontal part 114A in vertical direction.

The common electrode 118 is connected to the common line 116 and is formed in the pixel region 105. Specially, the common electrode 118 is formed in parallel with the finger part 114B of the pixel electrode 114 in the pixel region 105.

Accordingly, a horizontal electric field is formed between the pixel electrode 114, to which the pixel signal is supplied via the thin film transistor 106, and the common electrode 118, to which the reference voltage is supplied via the common line 116. Specifically, the horizontal electric field is applied between the finger part 114B of the pixel electrode 114 and the common electrode 118. The liquid crystal molecules arranged in the horizontal direction between the thin film transistor array substrate and the color filter array substrate by the horizontal electric field rotate due to a dielectric anisotropy. Further, the light transmittance of the pixel region 105 differs in accordance with a rotation amount of the liquid crystal molecules and pictures can be represented.

The storage capacitor 120 consists of the common line 116 and the upper storage electrode 122 overlapping with the common line 116 with the gate insulating film 146, the active layer 148 and the ohmic contact layer 150 therebetween and being integral with the pixel electrode 114. The storage capacitor 120 allows a pixel signal charged in the pixel electrode 114 to be maintained until the next pixel signal is charged.

The gate line 102 is connected, via the gate pad 124, to a gate driver integrated circuit (IC)(not shown) mounted on a tape carried package (TCP). The gate pad 124 is extended from the gate line 102 and is exposed through a first contact hole 127 passing through a gate insulating film 146 and a passivation film 152. The gate pad 124 has an exposed structure of a metal layer that has a relatively high strength and corrosion resistance such as a titanium (Ti) and a tungsten (W) included in the gate line 102.

The common line 116 may be supplied with the reference voltage from an exterior power source (not shown) via the common pad 136. The common pad 136 is extended from the common line 116 and is exposed through a third contact hole 127 passing through a gate insulating film 146 and a passivation film 152. The common pad 136 has an exposed structure of metal layer such as a titanium (Ti) and a tungsten (W) as similar as the gate pad 124.

The gate line 102, the gate electrode 108, the common line 116 and common electrode 118 may have a double-layer structure of metal layers with a first and a second metal layer 142 and 144. Among the metal layers, a metal layer may be made of a metal that has a relatively high strength and corrosion resistance such as a titanium (Ti) and a tungsten (W). while the other metal layer may be made of a low resistance metal such as an aluminum (Al) system metal, a molybdenum (Mo) and a copper (Cu) that are conventionally employed as a gate metal.

In a case in which the first metal layer 142 is made of a metal that has a high strength and corrosion resistance, the gate pad 124 and the common pad 136 have an exposed structure in which the second metal layer 144 of an upper portion is removed and the first metal layer 142 of the lower portion is exposed. On the other hand, in a case in which the second metal layer 144 is made of a metal that has a high strength and corrosion resistance, the gate pad 124 and the common pad 136 have an exposed structure in which the second metal layer 144 of an upper portion is exposed.

The data line 104 is connected to a data driver IC (not shown) mounted on a TCP via the data pad 130. The data pad 130 is extended from the data line 104 and is exposed through a second contact hole 133 passing through a passivation film 152. The data pad 130 has an exposed structure of the metal layer that has a relatively high strength and corrosion resistance such as titanium (Ti) and tungsten (W) included in the data line 104. The data pad 130 of metal layer is connected to the TCP in which the data drive IC mounted thereon via antistrophic conductive film (ACF) having a conductive ball. Accordingly, although the process of attaching the data pad 130 and the TCP is repeatedly performed, the defect caused by the opening of the data pad 130 does not occur.

More specifically, the data line 104, the drain electrode 112, the pixel electrode 114 and the upper storage electrode 122 have a double-layer structure of metal layers stacked with a first and a second metal layers 154 and 156. One metal layer of the metal layers is made of a metal that has a relatively high strength and corrosion resistance such as a titanium (Ti) and a tungsten (W). Whereas, the second metal layer is made of a low resistance metal such as an aluminum (Al) system metal, a molybdenum (Mo) and a copper (Cu) that are generally employed as a gate metal.

In a case in which the first metal layer 154 is made of a metal having a high strength and corrosion resistance, the data pad 130 has an exposed structure in which the second metal layer 156 of an upper portion is removed and the first metal layer 154 of a lower portion is exposed. On the other hand, in a case in which the second metal layer 156 is made of a metal having a high strength and corrosion resistance, the data pad 130 has an exposed structure in which the second metal layer 156 of an upper portion is exposed.

Figure 6A:
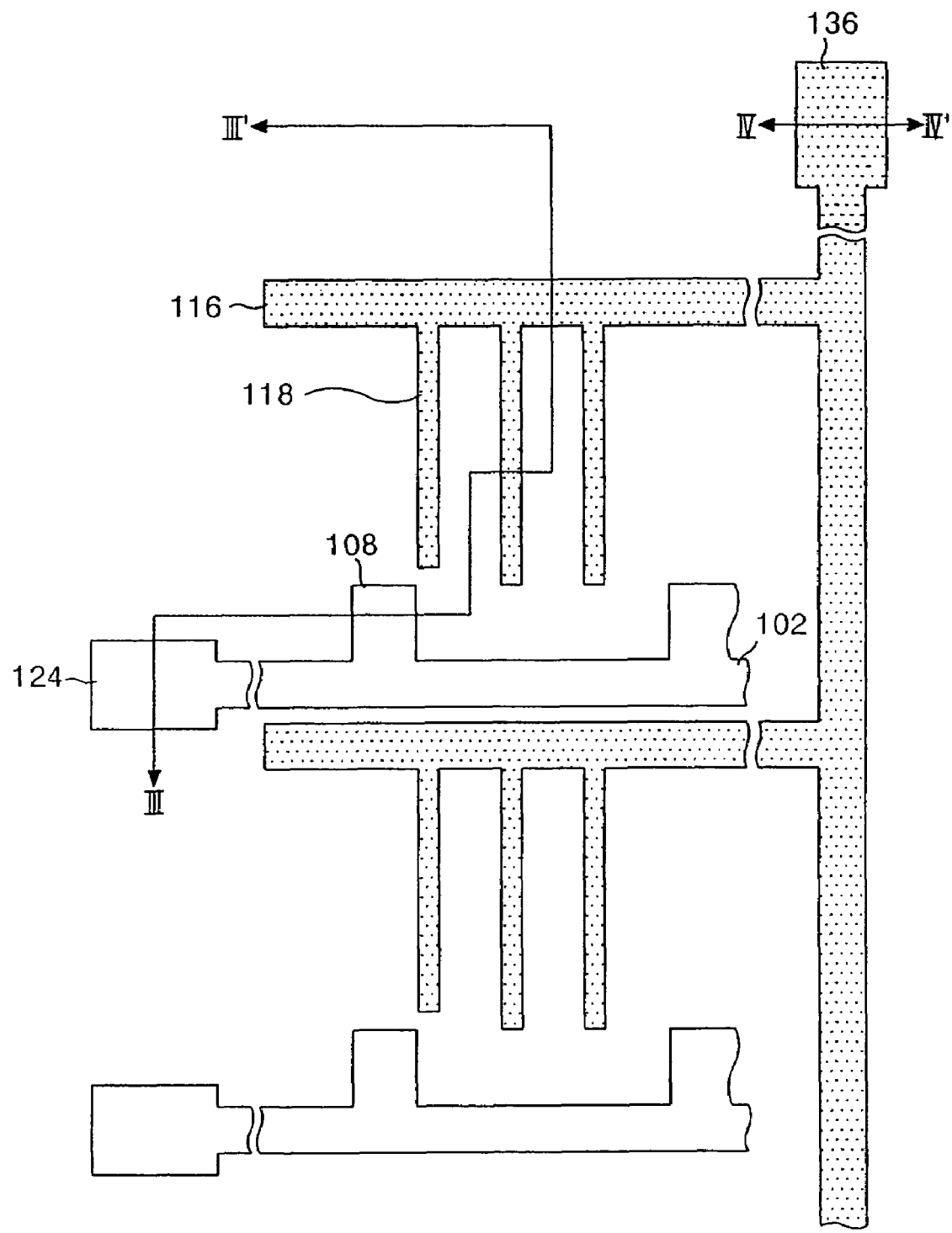

FIGS. 6A and 6B are a plan view and a sectional view, respectively, for explaining a first mask process of a manufacturing method of the thin film transistor array substrate having a horizontal electric field shown in FIGS. 4 and 5, respectively.

As shown in FIGS. 6A and 6B, a first conductive pattern group including the gate line 102, the gate electrode 108 and the gate pad 124, the common line 116, the common electrode 118 and the common pad 136 is formed on the lower substrate 145 using the first mask process.

The first mask process is explained with reference to FIGS. 7A to 7C.

A first gate metal layer 142 and a second gate metal layer 144 are sequentially formed on the lower upper substrate 145 by a deposition method such as sputtering, to form a gate metal layer having a double-layer structure as shown in FIG. 7A. Either one of the first gate metal layer 142 and the second gate metal layer 144 may be made of any metal that has a relatively high strength and corrosion resistance such as a titanium (Ti) and a tungsten (W), while another metal layer may be made of a metal such as an aluminum (Al) system metal, a molybdenum (Mo) and a copper (Cu). After the gate metal layer is formed, a photo-resist filed is formed entirely on the second gate metal layer 144 and then a first mask 300 is arranged on the lower substrate 145 as shown in FIG. 7B. The first mask 300 includes a mask substrate 304 which is a transparent material and a cut-off part formed on a cut-off region P2 of the mask substrate 304. A exposed region in which the mask substrate 304 is exposed becomes an exposure region P1. The photo-resist film is exposed and developed using the first mask 300 as set forth above, to form the photo-resist pattern 306 in the cut-off region P2 corresponding to the cut-off part 302 of the first mask 300. In FIG. 7C, the first and the second gate metal layer 142 and 144 are patterned by an etching process using the photo-resist pattern 306, to form the first conductive pattern group including the gate line, the gate electrode 108, the gate pad 124, the common line 116, the common electrode 118 and the common pad 136.

Figure 8A:
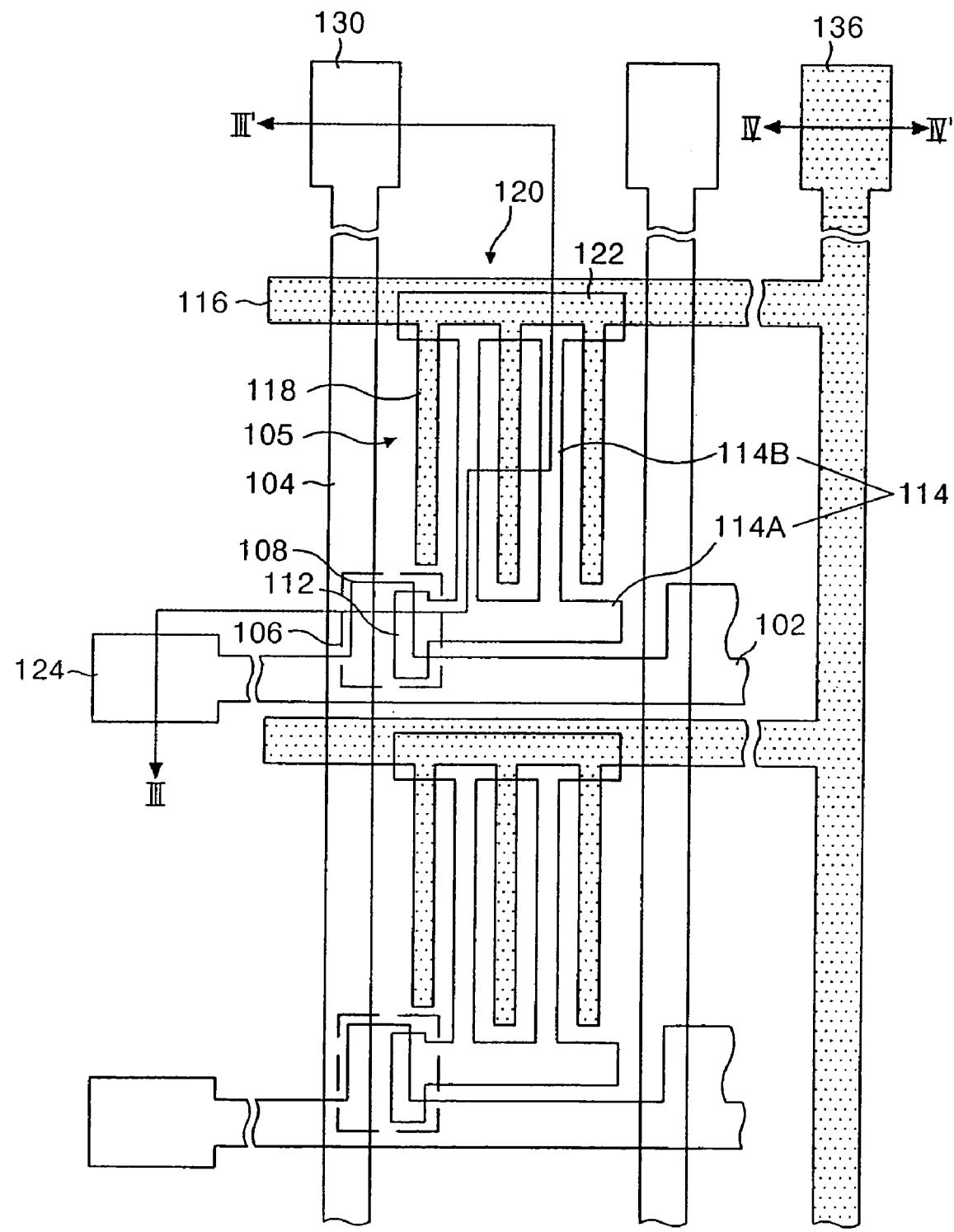
FIGS. 8A and 8B are a plan view and a sectional view, respectively, for explaining a second mask process of the manufacturing method of the thin film transistor array substrate according to an embodiment of the present invention.
Figure 8B:
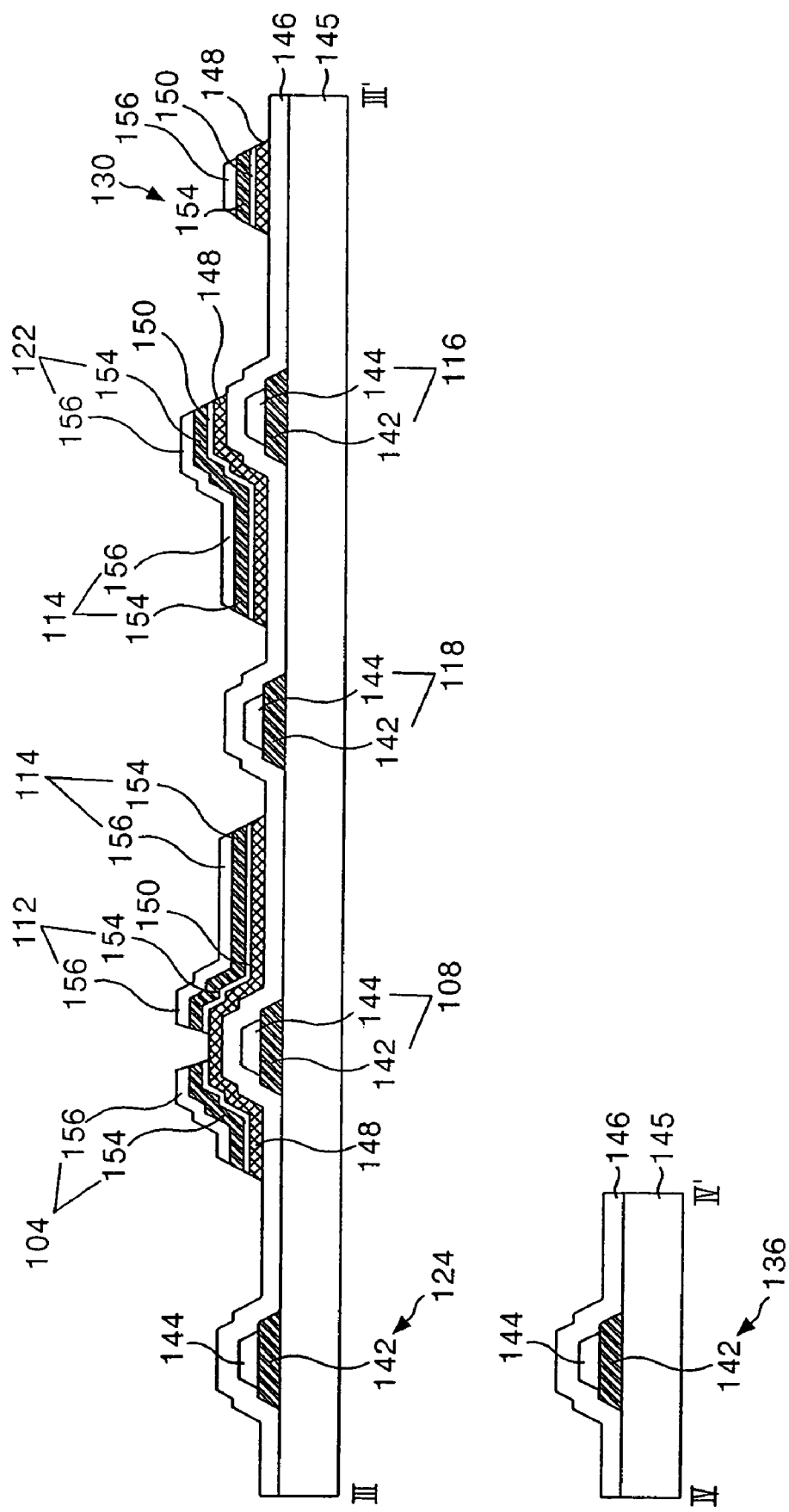

FIGS. 8A and 8B are a plan view and a sectional view for explaining a second mask process for the manufacturing method of the thin film transistor array substrate having an applied horizontal electric field according to an embodiment of the present invention.

A gate insulating film 146 is formed on the lower substrate 145 provided with the first conductive pattern group by a deposition method such as the plasma enhanced chemical vapor deposition (PECVD) or sputtering. The gate insulating film 146 is made of an inorganic insulating material such as silicon oxide (SiOx) or silicon nitride (SiNx).

Further, as shown in FIGS. 8A and 8B, a semiconductor pattern group including an active layer 148 and the ohmic contact layer 150 and a second conductive pattern group including the data line 104, the drain electrode 112, the pixel electrode 114, the data pad 130 and the upper storage electrode 122 are formed on the gate insulating film 146 using the second mask process. The second mask process is explained with reference to FIGS. 9A to 9E.

As shown in FIG. 9A, on the gate insulating film 146, a first semiconductor layer 147, a second semiconductor layer 149, a first and a second source/drain metal layer 154 and 156 are sequentially provided by deposition techniques such as plasma enhanced chemical vapor deposition (PECVD) and sputtering, etc. The first semiconductor layer 147 may be made of amorphous silicon in which an impurity is not doped, and the second conductor layer 149 may be made of amorphous silicon in which an impurity of a N type or P type is doped. Any one of the first and the second source/drain metal layers 154 and 156 may be made of a metal that has a relatively high strength and corrosion resistance such as a titanium (Ti) and a tungsten (W), while the other metal layer may be made of a metal such as an aluminum (Al) system metal, a molybdenum (Mo) and a copper (Cu).

Figure 9B:
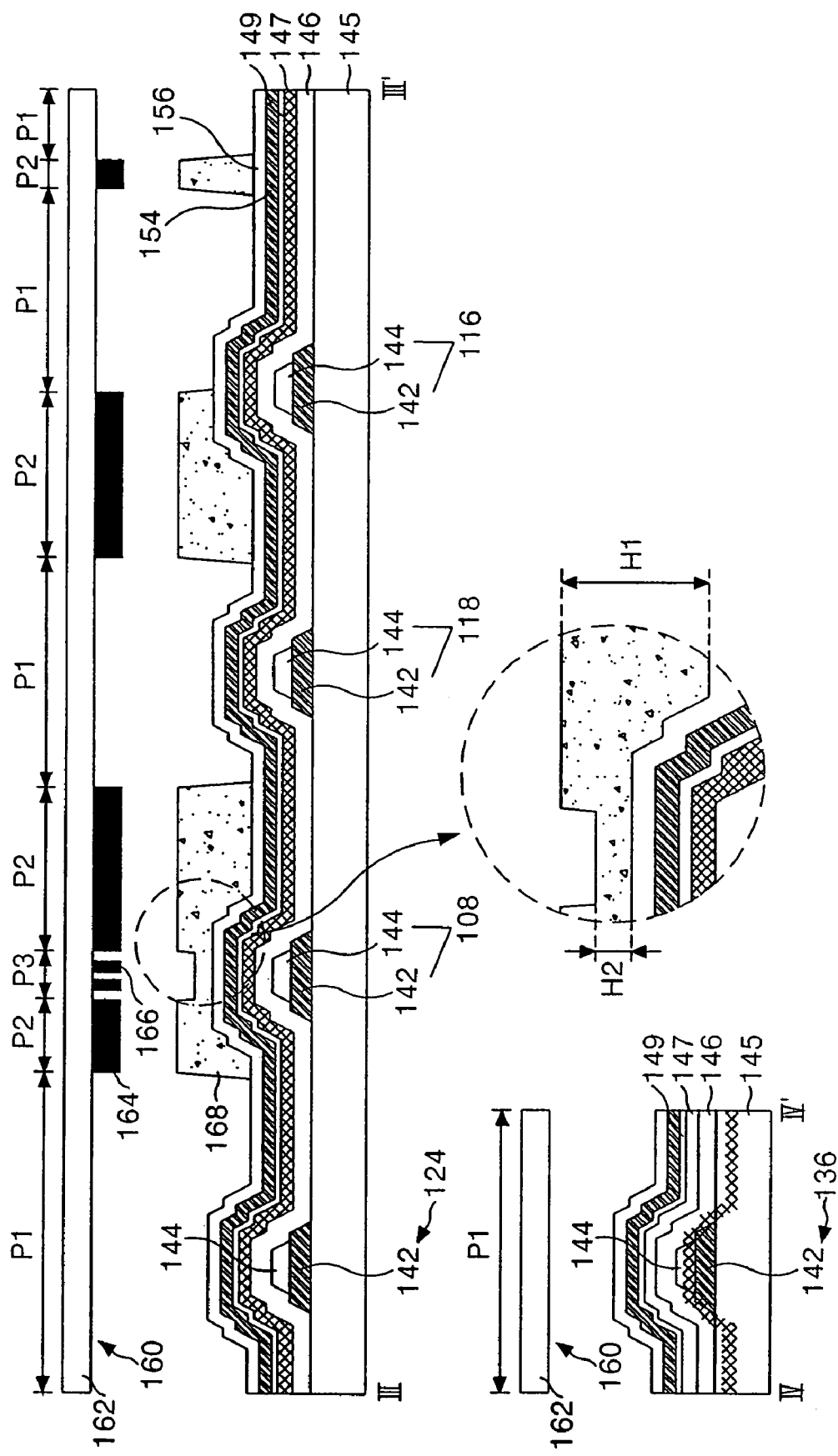

Next, a photo-resist film is formed on the second source/drain metal layer 156 and then a second mask 160 used for a partial exposure is arranged on the lower substrate 145 as shown in FIG. 9B. The second mask 160 includes a mask substrate 162 which is a transparent material, a cut-off part 164 formed on a cut-off region P2 of the mask substrate 162 and a diffractive exposure part 166 (or a semi-transmitting part) formed on a partial exposure region P3 of the mask substrate 162. A region in which the mask substrate 162 is exposed is an exposure region P1. The photo-resist film is exposed and then developed using the second mask 160 as set forth above, to form the photo-resist pattern 168 which has a stepped part in the cut-off region P2 and the partial exposure region P3 corresponding to the diffractive exposure part 166 and cut-off part 164 of the second mask 160. More particularly, the photo-resist pattern 168 formed in the partial exposure region P3 has a second height H2 that is lower than a first height H1 of the photo-resist pattern 168 formed in the cut-off region P2.

Figure 9C:
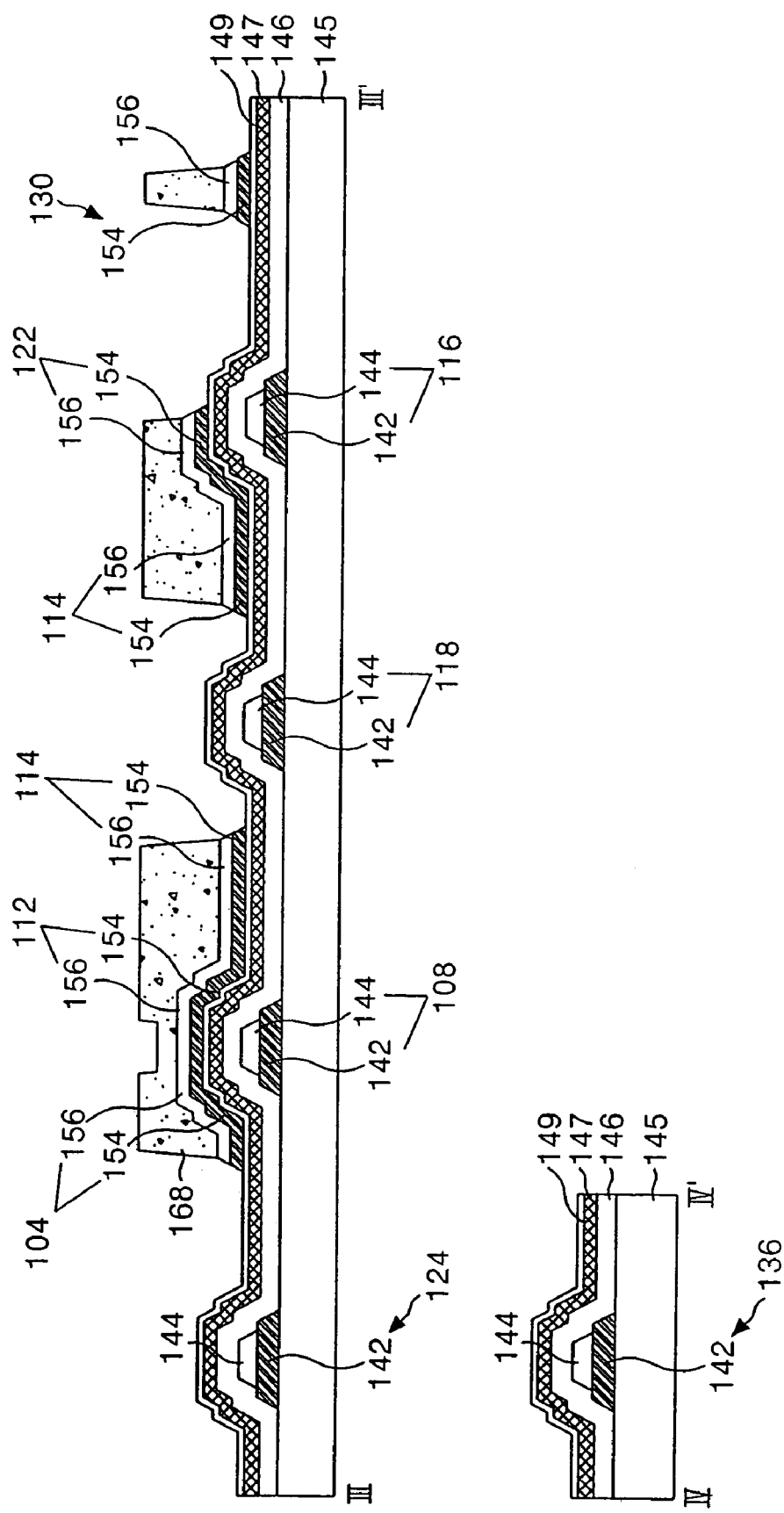

Subsequently, the first and the second source/drain metal layer 154 and 156 are patterned by a wet etching process using the photo-resist pattern 168, so that the second conductive pattern group including the data line 104, the drain electrode 112 being integral to the source electrode connected to the data line 104, the pixel electrode 114, the upper storage electrode 122 and the data pad 130 is formed as shown in FIG. 9C.

Figure 9D:
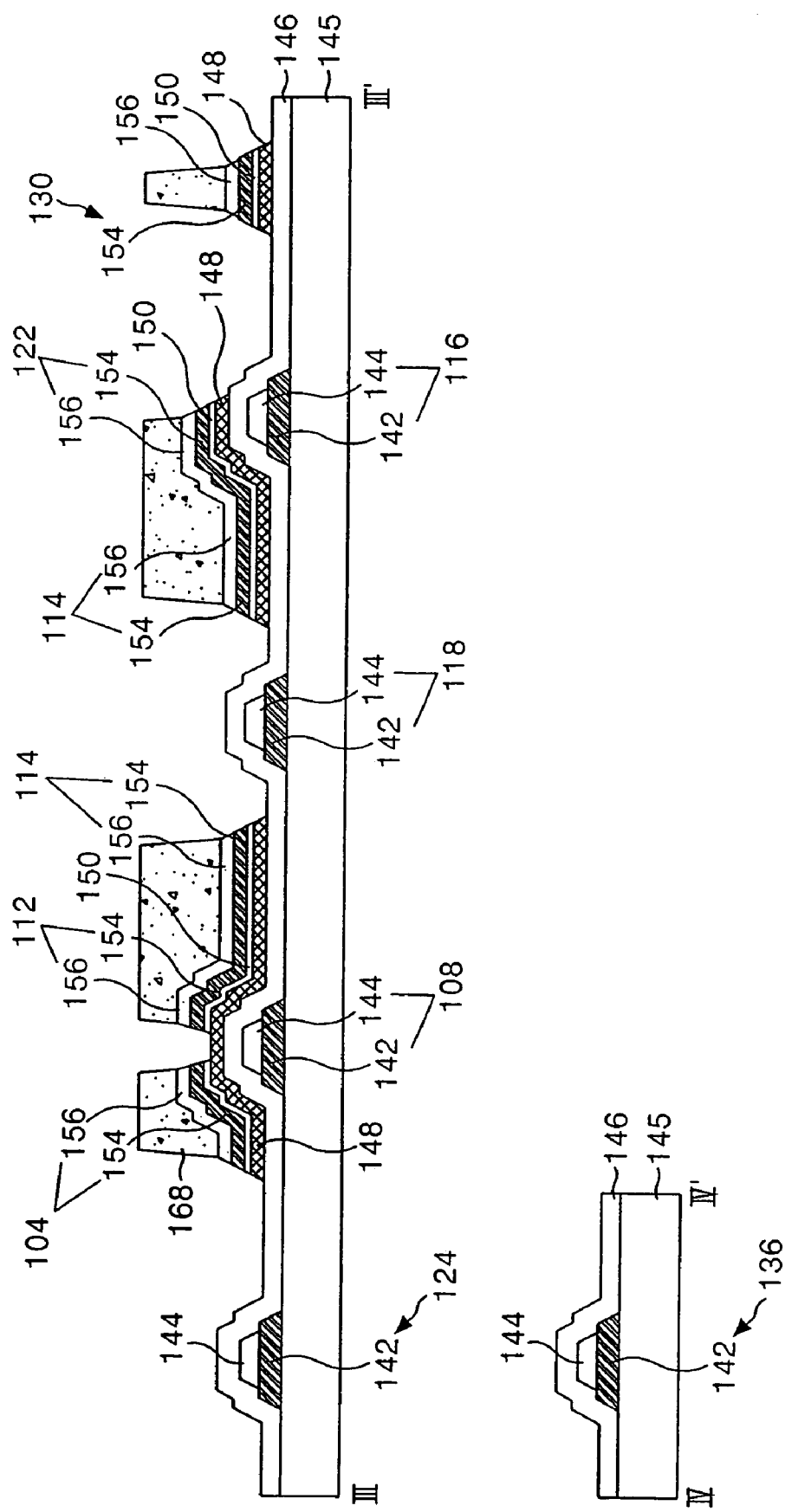

In FIG. 9D, the first semiconductor layer 147 and the second semiconductor layer 149 are patterned by a dry etching process using the photo-resist pattern 168 as a mask to provide the ohmic contact layer 150 and the active layer 148 along the second conductive pattern group. Next, the photo-resist pattern 168 formed with the second height H2 in the partial exposure region P3 is removed by the ashing process using an oxygen (O2) plasma, while the photo-resist pattern 168 formed with the first height H1 in the cut-off region P2 has a lowered height. The partial exposure region P3 by the etching process using the photo-resist pattern 168, that is, the first and the second source/drain metal layers 154 and 156 formed at a channel portion of the thin film transistor are removed. In a case in which the second source/drain metal layer 156 is made of molybdenum Mo and the first source/drain metal layer 154 is made of titanium Ti, the second source/drain metal layer 156 is removed in the channel portion by a dry etching process and the first source/drain metal layer 154 is removed by a wet etching process in the channel portion. In a case in which the second source/drain metal layer 156 is made of titanium Ti and the first source/drain metal layer 154 is made of molybdenum Mo, the second source/drain metal layer 156 is removed by a wet etching process in the channel portion and the first source/drain metal layer 154 is removed by a dry etching process in the channel portion. Accordingly, the drain electrode 112 is separated from the data line 104 including the source electrode. Thereafter, the ohmic contact layer 150 is removed by a dry etching process using the photo-resist pattern 168 to expose the active layer 148.

In FIG. 9E, the photo-resist pattern 168 left on the second conductive pattern group is removed by a stripping process.

Figure 10A:
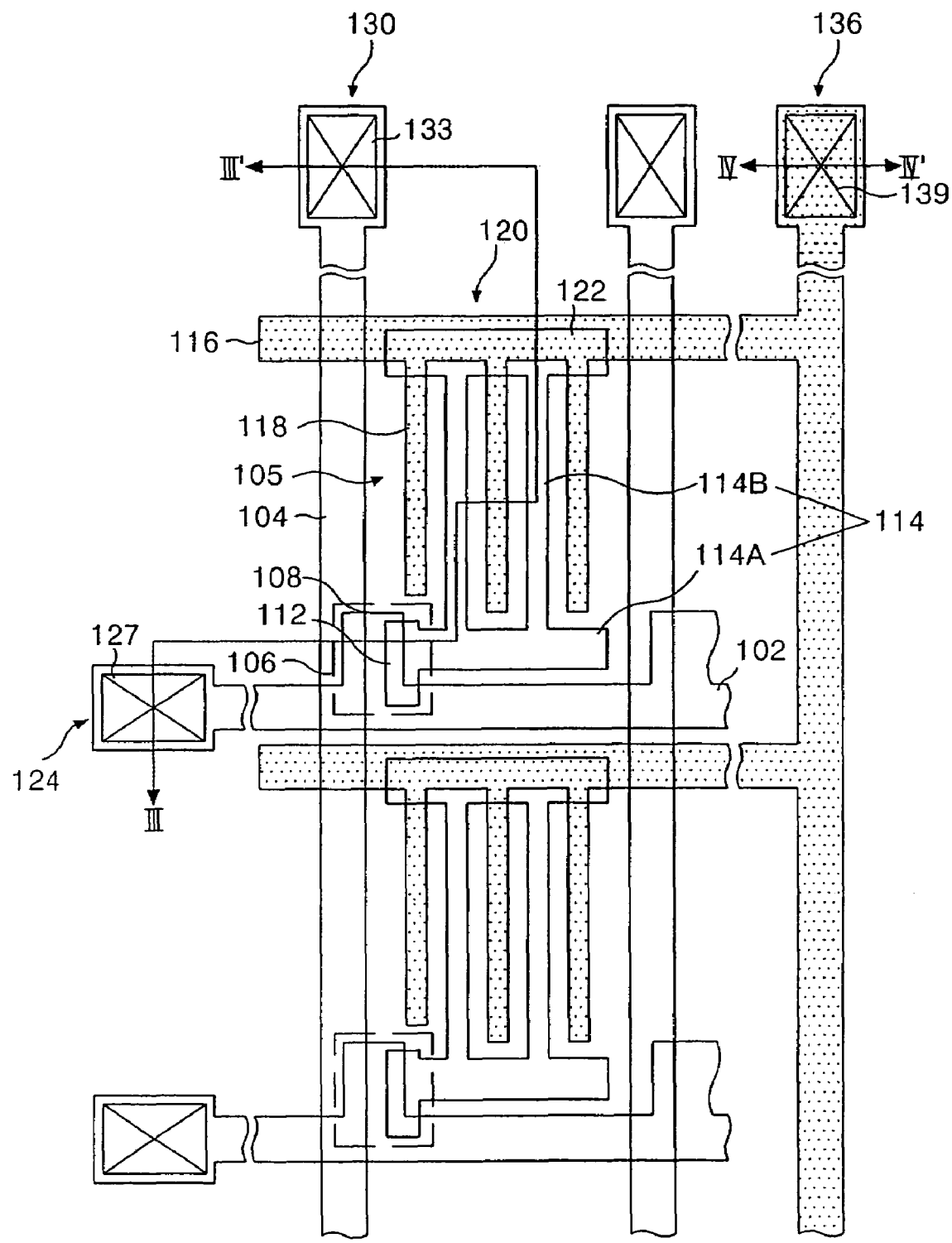
FIGS. 10A and 10B are a plan view and a sectional view, respectively, illustrating a third mask process among the manufacturing method of the thin film transistor array substrate according to an embodiment of the present invention.
Figure 10B:
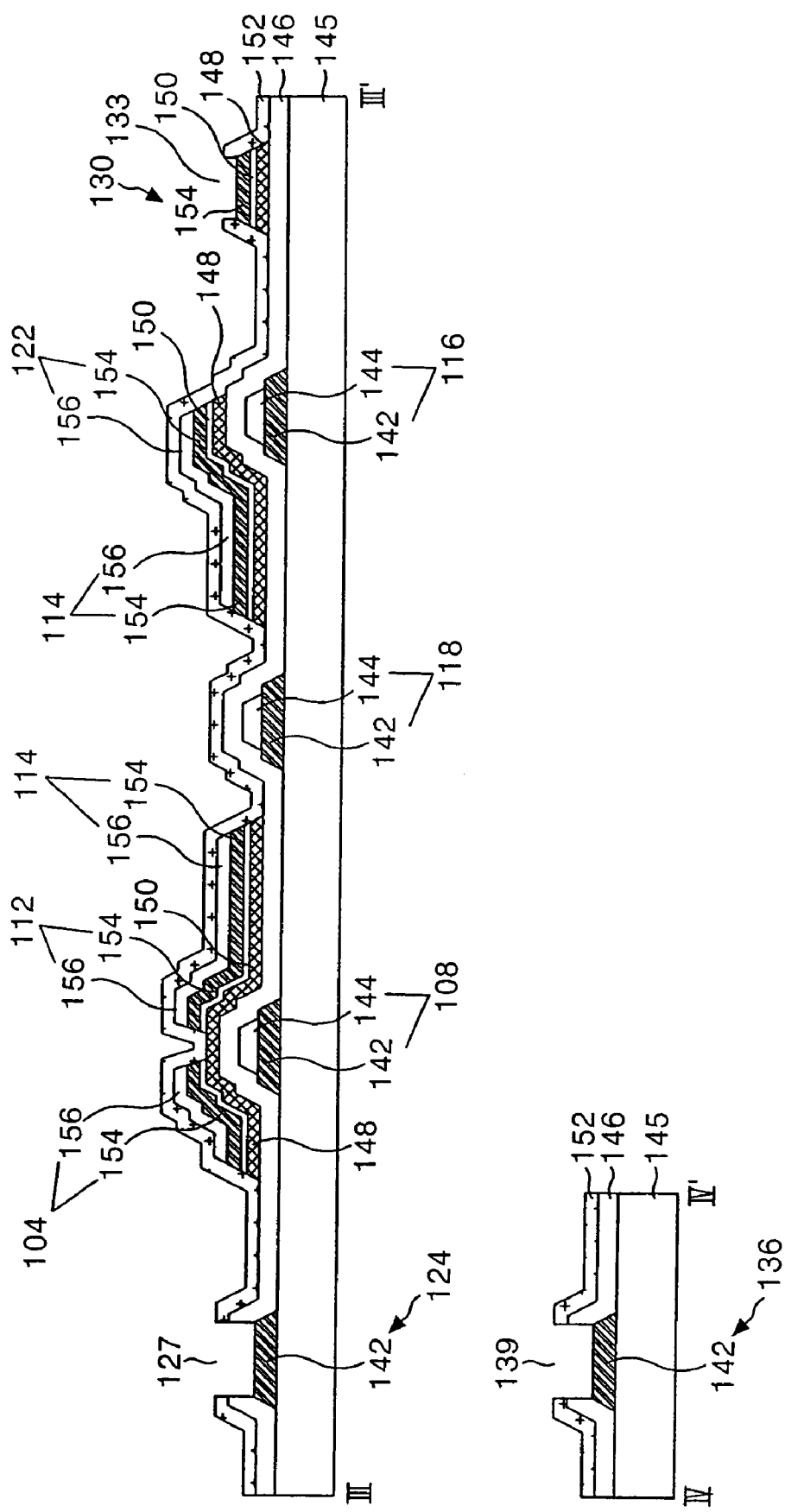

FIGS. 10A and 10B are a plan view and a sectional view, respectively, for explaining a third mask process of the manufacturing method of the thin film transistor array substrate according to an embodiment of the present invention, respectively.

Figure 11A:
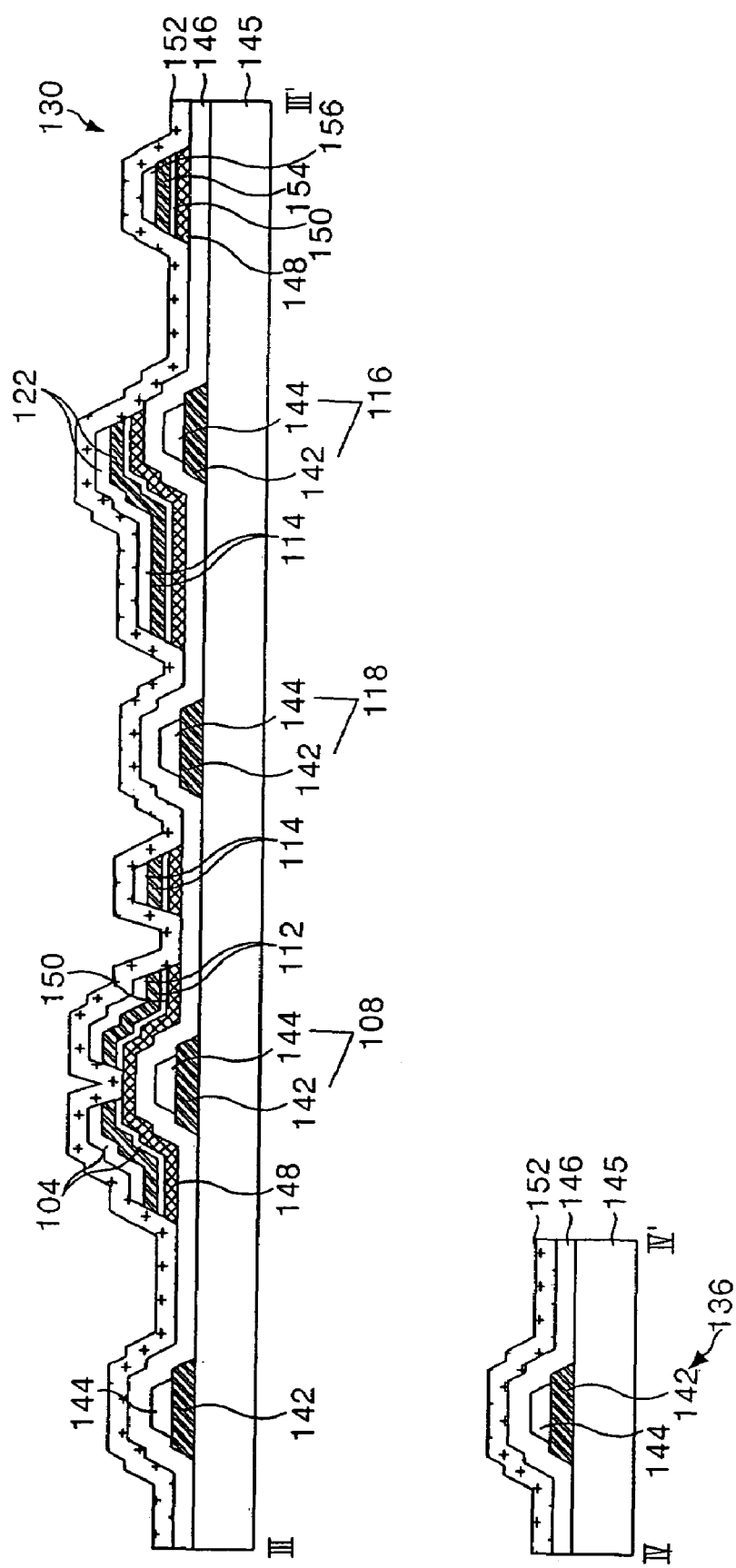

The passivation film 152 including first to third contact holes 127, 133 and 139 is formed on the gate insulating film 146 stacked with the semiconductor pattern and a second conductive pattern group by the third mask process as shown in FIGS. 10A and 10B. The third mask process is explained with reference to FIGS. 11A to 11C.

The passivation film 152 may be formed by a deposition technique such as plasma enhanced chemical vapor deposition (PECVD) on the gate insulating film 146 where the semiconductor pattern and the source/drain metal pattern are stacked. The passivation film 152 may be made of an inorganic material such as the gate insulating film 146 or an organic material having a small dielectric constant such as an acrylic organic compound, BCB (benzocyclobutene) or PFCB (perfluorocyclobutane), etc. Subsequently, in FIG. 11B, the photo-resist film is formed entirely on the passivation film 152 and the third mask 310 is arranged on the lower substrate 145 as shown in FIG. 11B. The third mask 310 includes a mask substrate 314 which is a transparent material, a cut-off part 312 formed in a cut-off region P2 of the mask substrate 314. A region in which the mask substrate 314 is exposed is an exposure region P1. The photo-resist film is exposed and then developed using the third mask 310 to form the photo-resist pattern 316 in the cut-off region P2 based upon the cut-off part 312 of the third mask 310. The passivation film 152 is patterned by the etching process using the photo-resist pattern 316 to thereby form the first to the third contact holes 127, 133 and 139.

In FIG. 11C, the first contact hole 127 is formed in such a manner to pass through the passivation film 152 and the gate insulating film 146 and expose the gate pad 124, the second contact hole 133 is formed in such a manner to pass through the passivation film 152 and expose the data pad 130, and the third contact hole 139 is formed in such a manner to pass through the passivation film 152 and the gate insulating film 146 and expose the common pad 136. The exposed gate pad 124, the data pad 130 and the common pad 136 have an exposed structure of metal that has a high strength and corrosion resistance. In this case, the gate pad 124, the data pad 130 and the common pad 136 have two structures as shown in FIGS. 12 and 13.

For example, in a case in which the first gate metal layer 142 of a lower portion is made of a titanium Ti and the second gate metal layer 144 of an upper portion is made of a molybdenum Mo, the gate pad 124 and the common pad 136 consists of only the first gate metal layer 142 of the lower portion as shown in FIG. 12. This is because the second gate metal layer 144 of the upper portion is removed by the etching process employed to form the first and the third contact hole 127 and 139.

Figure 13:
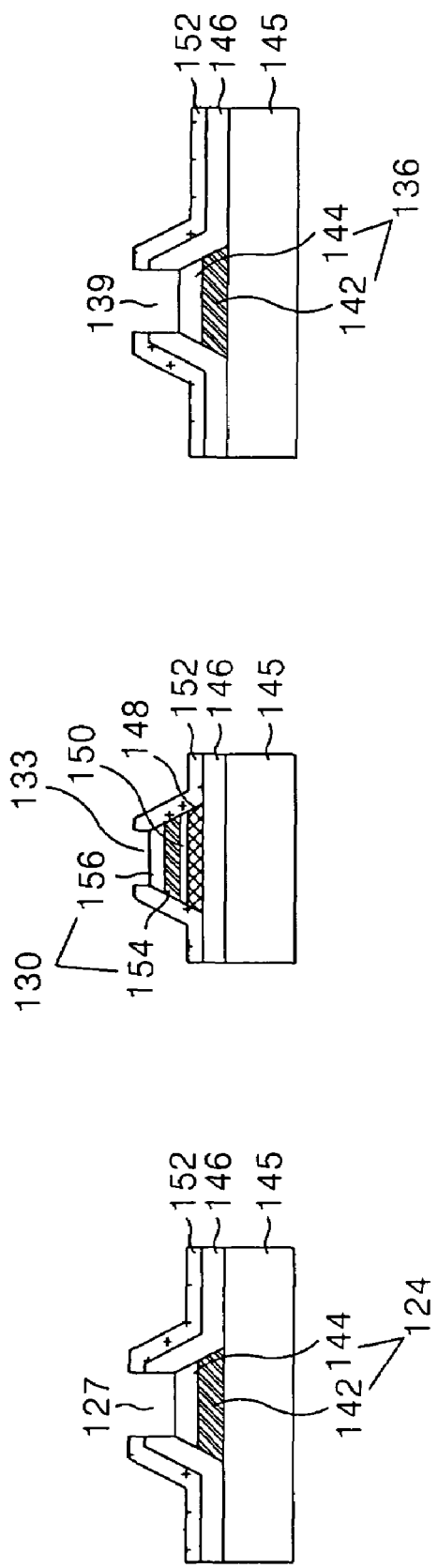
FIG. 13 is a sectional view showing pads of a second structure of the thin film transistor substrate according to an embodiment of the present invention.

On the contrary, in a case in which the first gate metal layer 142 of the lower portion is made of a molybdenum Mo and the second gate metal layer 144 of the upper portion is made of a titanium Ti, the gate pad 124 and the common pad 136 have a double-layer structure of metal layers in which the first and the second gate metal layers 142 and 144 are stacked as shown in FIG. 13. Also, the gate pad 124 and the common pad 136 have an exposed structure of the gate metal layer 144 of the upper portion through the use of the first and the third contact hole 127 and 139.

Further, in case where the first source/drain metal layer 154 of the lower portion is made of a titanium Ti and the second source/drain metal layer 156 of the upper portion is made of a molybdenum Mo, the data pad 130 is consisted of only the first source/drain metal layer 154 of the lower portion as shown in FIG. 12. This is because the second source/drain metal layer 156 is removed for the etching process employed to form the second contact hole 133.

On the contrary, in case where the first source/drain metal layer 154 of the lower portion is made of a molybdenum Mo and the second source/drain metal layer 156 is made of a titanium Ti, the data pad 130 has a double-layer structure of metal layers in which the first and the second source/drain metal layers 154 and 156 are stacked as shown in FIG. 13. Also, the data pad 130 has an exposed structure of the source/drain metal layer 156 of the upper portion through the use of the second contact hole 133.

As described above, in an embodiment of thin film transistor array substrate having a horizontal electric field and the method of fabricating thereof of the present invention, the pixel electrode 114 is formed of a metal similar to the drain electrode 112. Further, the gate pad 124, the data pad 130 and the common pad 136 use a metal that has a high strength and corrosion resistance enough to prevent the defect caused by the opening of the pad irrespective of the repeated process of attaching the TCP. Accordingly, a transparent conductive film is free in the present invention, that is, the process including the transparent conductive film deposition process and patterning process is unnecessary, which permits the reduction of one mask process. In other words, the thin film transistor array substrate having an applied horizontal electric field according to the present invention is formed using a three-round mask process.

The thin film transistor array substrate formed using the three-round mask process and the color filter array substrate formed using a separate process are prepared and combined and then a liquid crystal is injected therebetween, to fabricate a liquid panel. In this case, the color filter array substrate is combined with the thin film transistor array substrate to expose a pad region where the gate pad 124, the data pad 130 and the common pad 136 are formed on the thin film transistor array substrate.

Figure 14:
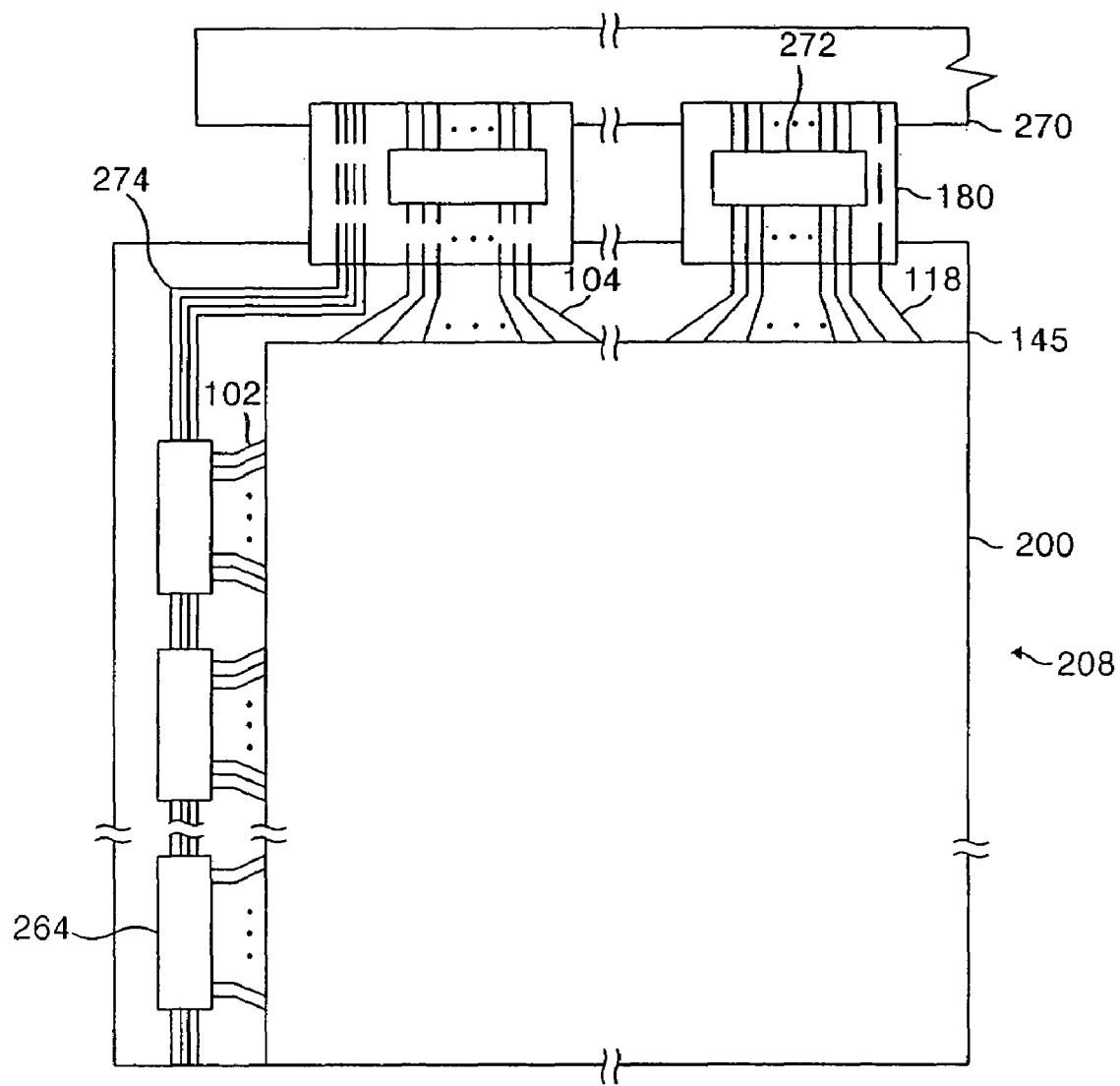
FIG. 14 is a plan view showing a liquid crystal display having the thin film transistor array substrate shown in FIG. 4.
Figure 15:
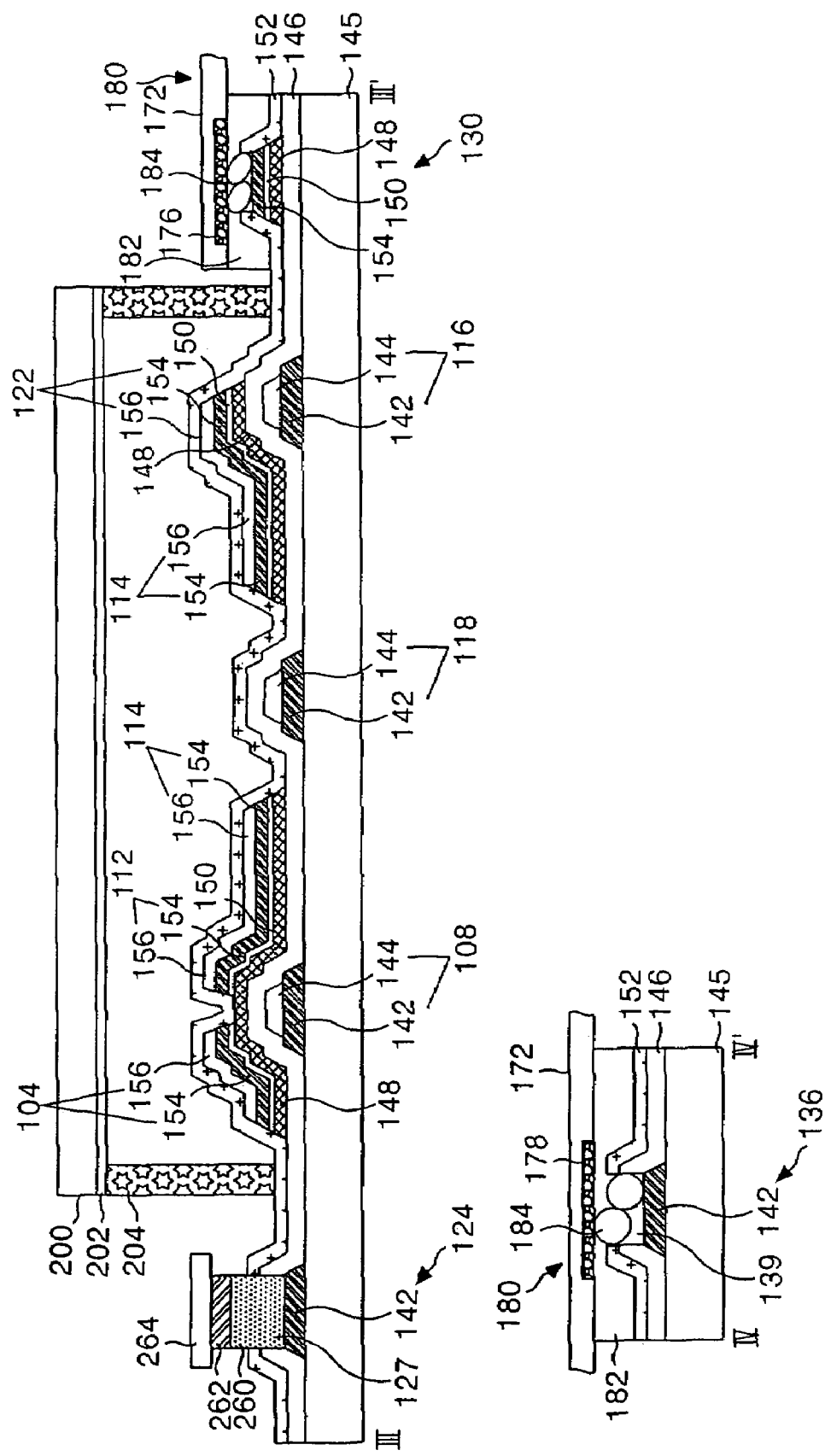
FIG. 15 is a sectional view of the liquid crystal display shown in FIG. 14.

FIG. 14 is a plan view representing a liquid crystal display according to the present invention, and FIG. 15 is a sectional view representing the liquid crystal display shown in FIG. 14.

Referring to FIGS. 14 and 15, the liquid crystal display according to the present invention includes a gate drive IC 264 mounted on a lower substrate 145 of a liquid crystal panel 208 and a data drive IC 272 mounted on a TCP 180.

The gate drive ICs 264 are mounted by a COG (a Chip on Glass) system on the lower substrate 145 and are connected to gate lines 102 via the gate pad 124 to supply a gate signal to the gate lines 102.

Gate control signals and power source signals from a timing controller and a power source portion (not shown) on a PCB (a Printed Circuit Board) 270 are supplied to a signal supplying line 274 via the data TCP 180. The signal supplying line 274 is connected to an input terminal of the gate drive ICs 264 through an input bump and supplies the gate control signals and the power source signals to the gate drive IC 264. The gate drive IC 264 makes a gate-driving signal using the gate control signals and the power source signals. The gate driving signals are supplied to the gate pad 124 through an output bump 260 connected to output terminals 262 of the gate drive IC 264.

The data drive ICs 272 are mounted by a TAB (a Tape Automated Bonding) system on the TCP 180 and are connected to data lines 104 via a data pad 130. Specifically, the TCP 180, which the data drive ICs 272 are mounted, is attached using an ACF (an Antistrophic Conductive Film) 182 including a conductive ball 184 on a data pad region. Accordingly, output pads 176 formed on a base film 172 of the TCP 180 are electrically connected to the data pad 130, via the ACF 182. Further any one of dummy output pads 178 formed on the base film 172 of the TCP 180 on which the data drive ICs 272 are mounted is electrically connected to the common pad 136 via the ACF 182.

Figure 16:
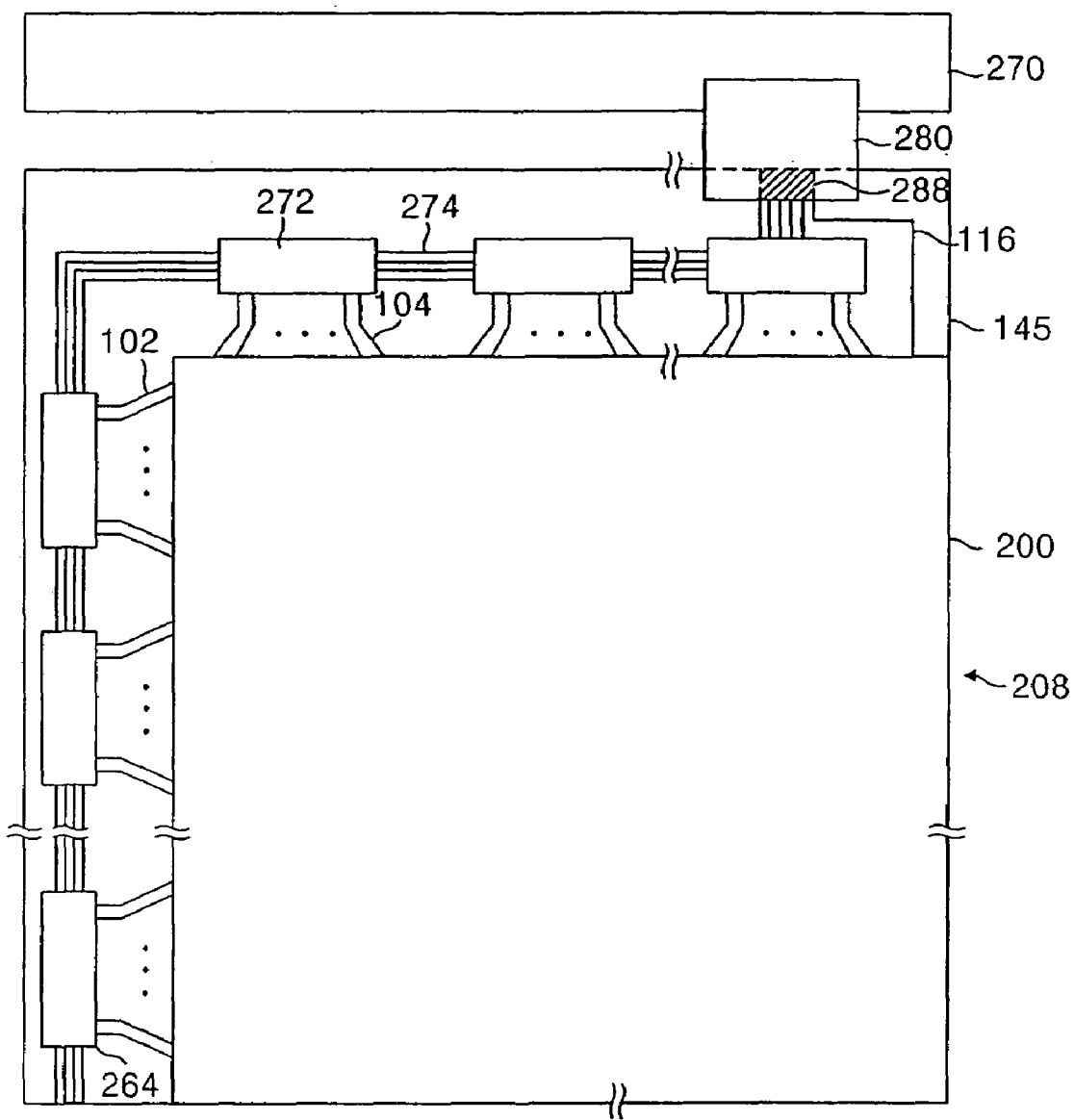
FIG. 16 is a plan view illustrating another liquid crystal display having the thin film transistor array substrate shown in FIG. 4.

FIG. 16 is a plan view representing another type of liquid crystal display according to the present invention and FIG. 17 is a sectional view representing the liquid crystal display shown in FIG. 16.

Referring to FIGS. 16 and 17, the liquid crystal display according to the present invention includes a gate drive IC 264 and a data drive IC mounted on a lower substrate 145 of a liquid crystal panel 208 and a FPC (a Flexible Printed Circuit) 280 for supplying a driving signal to the 264 and 267.

The data drive ICs 272 are mounted by a COG (a Chip on Glass) system on the lower substrate 145 and is connected to data lines 104 via the data pad 130.

As an example, data control signals and data signals from a timing controller and a power source portion not shown on a PCB 270 are supplied to a signal supplying line 274 via the FPC 280 and a COG connector 288. The signal supplying line 274 is connected to an input terminal of the data drive ICs 272 through an input bump and supplies the data control signals and the data signals to the data drive IC 272. The data drive IC 272 makes a data-driving signal using the data control signals and the data signals. The data driving signals are supplied to the data pad 130 through an output bump 286 connected to output terminals 284 of the data drive IC 272.

The gate drive ICs 264 are mounted by COG system on the lower substrate 145 and are connected to gate lines 102 via the gate pad 124.

Gate control signals and power source signals from a timing controller and a power source portion not shown on PCB 270 are supplied to a signal supplying line 274 via the FPC 280 and the COG connector 288. The signal supplying line 274 is connected to an input terminal of the gate drive ICs 264 through an input bump and supplies the gate control signals and the power source signals to the gate drive IC 264. The gate drive IC 264 makes a gate-driving signal using the gate control signals and the power source signals. The gate driving signals are supplied to the gate pad 124 through an output bump 260 connected to output terminals 262 of the gate drive IC 264.

The FPC 280 supplies gate control signals and power source signals from the timing controller and a power source portion to its corresponding drive ICs 264 and 272. That is, input pad of the FPC is connected to the PCB 279 and output pad of the FPC 280 is connected to the COG connector 288 of the signal supplying line 274.

Further, any one of output pad 282 of the FPC 280 is connected to the common pad 136 using the ACF 182 including the conductive ball 184 and supplies reference voltage for driving liquid crystal to the common line 116.

Any one of the gate drive IC 264 and the data drive IC 272 may be mounted by the COG system on the lower substrate such that corrosion of exposed metal layer in the exposed gate pad 124, the exposed data pad 130 and the common pad 136 is prevented.

In the thin film transistor array substrate having a horizontal electric field and the manufacturing method thereof, the pixel electrode is formed of metal identical to the drain electrode, and the pads have the structure wherein a metal layer having a high strength and corrosion resistance is exposed in order to prevent the defect caused by the opening. Accordingly, it is possible to manufacture the thin film transistor array substrate using the three-round mask process and simplify the structure and processes of the thin film transistor array substrate, and reduce the manufacturing cost and improve the manufacture yield.

Further, the liquid crystal display having a horizontal electric field and the manufacturing method thereof according to a second embodiment of the present invention are capable of preventing corrosion of a metal layer of an exposed pad due to a drive IC mounted by a COG system directly on a substrate.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a liquid crystal display having a horizontal electric field comprising:
   preparing a thin film transistor array substrate having a gate line and a data line, wherein a thin film transistor is formed at a crossing of the gate line and the data line, wherein the horizontal electric field is formed between a pixel electrode connected to the thin film transistor and a common electrode;
   forming a conductive layer in a gate pad, a data pad, and a common pad, wherein an entire upper surface of the gate pad, data pad and common pad is surrounded and exposed through a passivation film; and
   mounting a driving integrated circuit on the substrate, wherein at least one of the exposed gate pad and the data pad is directly connected to the driving integrated circuit.

2. The method according to claim 1, wherein mounting the driving integrated circuit on the substrate includes directly connecting the gate pad to the driving integrated circuit.

3. The method according to claim 2, further including directly connecting the data pad to the driving integrated circuit.

4. The method according to claim 2, wherein mounting the driving integrated circuit on the substrate further includes connecting the data pad with the driving integrated circuit using a conductive film.

5. The method according to claim 1, wherein preparing the thin film transistor substrate includes:
   forming, on the substrate, a first conductive pattern group including the gate line, a gate electrode connected to the gate line, a common line, the common electrode, the gate pad and the common pad wherein the common line is substantially in parallel to the gate line;
   forming a gate insulating film on the substrate having the first conductive pattern group thereon;
   forming a semiconductor layer at a predetermined area of the gate insulating film and a second conductive pattern group having the data line, the data pad a source electrode of the thin film transistor connected with the data line, a drain electrode of the thin film transistor being opposite to the source electrode, a pixel electrode connected to the drain electrode and substantially parallel to the common electrode and the data line; and
   forming a passivation film to expose the gate pad, the data pad and the common pad on the gate insulation film having the second conductive pattern group and the semiconductor layer formed thereon.

6. The method according to claim 5, wherein the first conductive pattern group is formed to have a double-layer structure including a main conductive layer and a secondary conductive layer formed of a metal that has a relatively high strength and corrosion resistance, and wherein the secondary conductive layer of the gate pad and common pad protects against an opening of the main conductive layer of the gate pad and the common pad.

7. The method according to claim 6, wherein forming the passivation film includes exposing the secondary conductive layer of the gate pad and the common pad.

8. The method according to claim 6, wherein forming the passivation film includes forming a contact hole that passes through the passivation film and the gate insulating film to expose the secondary conductive layer.

9. The method according to claim 6, wherein the forming the passivation film includes forming a contact hole that passes through the passivation film, the gate insulation film and the main conductive layer to expose the secondary conductive layer.

10. The method according to claim 6, wherein the main layer includes at least one of an aluminum system metal, a copper, a molybdenum, a chrome and a tungsten which is a low resistance metal, and wherein the secondary conductive layer includes a titanium.

11. The method according to claim 5, wherein the second conductive pattern group having the data line, the data pad, the source electrode, the drain electrode, and the pixel electrode is formed to have a double-layer structure including a main conductive layer and a secondary conductive layer formed of a metal that has a relatively high strength and corrosion resistance, and wherein the secondary conductive layer of the data pad protects against an opening of the main conductive layer of the data pad.

12. The method according to claim 11, wherein forming the passivation film includes exposing the secondary conductive layer of the data pad.

13. The method according to claim 11, wherein forming the passivation film includes forming a contact hole that passes through the passivation film to expose the secondary conductive layer.

14. The method according to claim 11, wherein forming the passivation film includes forming a contact hole that passes through the passivation film and the main conductive layer of the data pad to expose the secondary conductive layer.

15. The method according to claim 11, wherein the main conductive layer includes at least one of an aluminum system metal, a copper, a molybdenum, a chrome and a tungsten which is a low resistance metal, and wherein the secondary conductive layer includes a titanium.

* * * * *